United States Patent
Asami et al.

(10) Patent No.: US 7,214,625 B2
(45) Date of Patent: May 8, 2007

(54) METHOD FOR MANUFACTURING MOVABLE PORTION OF SEMICONDUCTOR DEVICE

(75) Inventors: Kazushi Asami, Okazaki (JP); Junji Oohara, Nisshin (JP); Hiroshi Muto, Nagoya (JP); Kazuhiko Sugiura, Nagoya (JP); Tsuyoshi Fukada, Aichi-gun (JP); Yukihiro Takeuchi, Nishikamo-gun (JP)

(73) Assignee: Denso Corporation, Kariya (JP)

( * ) Notice: Subject to any disclaimer, the term of this patent is extended or adjusted under 35 U.S.C. 154(b) by 429 days.

(21) Appl. No.: 10/936,539

(22) Filed: Sep. 9, 2004

(65) Prior Publication Data

US 2005/0054153 A1     Mar. 10, 2005

(30) Foreign Application Priority Data

Sep. 10, 2003 (JP) .............................. 2003-318267
Sep. 17, 2003 (JP) .............................. 2003-324586

(51) Int. Cl.
*H01L 21/302* (2006.01)
*H01L 21/461* (2006.01)
*H01L 29/82* (2006.01)

(52) U.S. Cl. ................ 438/719; 438/710; 257/419
(58) Field of Classification Search ................ 438/710, 438/719, 52, 739; 257/417, 419; 216/39, 216/67

See application file for complete search history.

(56) References Cited

U.S. PATENT DOCUMENTS

| | | | |
|---|---|---|---|
| 6,187,685 B1 | 2/2001 | Hopkins et al. | |
| 6,250,165 B1 | 6/2001 | Sakai et al. | |
| 6,277,756 B1 | 8/2001 | Ohara et al. | |
| 6,365,056 B1 | 4/2002 | Robert et al. | |
| 6,399,516 B1 | 6/2002 | Ayon | |
| 6,740,537 B2 | 5/2004 | Helin | |

FOREIGN PATENT DOCUMENTS

| | | |
|---|---|---|
| JP | A-4-105318 | 4/1992 |
| JP | A-8-181125 | 7/1996 |

*Primary Examiner*—Calvin Lee
(74) *Attorney, Agent, or Firm*—Posz Law Group, PLC

(57) ABSTRACT

A method for manufacturing a semiconductor device having a movable portion includes the steps of: forming a trench on a semiconductor layer so that the trench reaches an insulation layer; and forming a movable portion by etching a sidewall of the trench so that the semiconductor layer is separated from the insulation layer. The steps of forming the trench and forming the movable portion are performed by a reactive ion etching method. The insulation layer disposed on the bottom of the trench is prevented from charging positively in the step of forming the trench. The insulation layer disposed on the bottom of the trench is charged positively in the step of forming the movable portion.

56 Claims, 14 Drawing Sheets

FIG. 17A  FIG. 17B  FIG. 17C
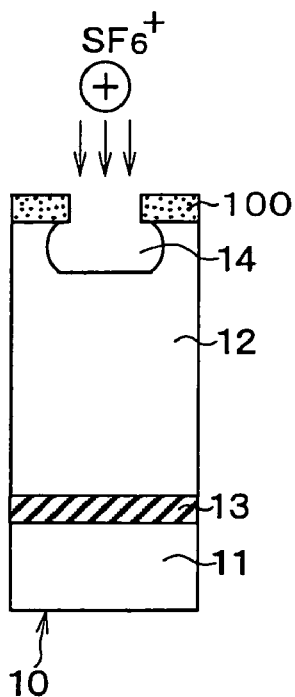
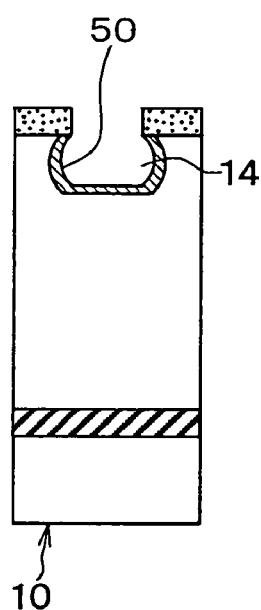
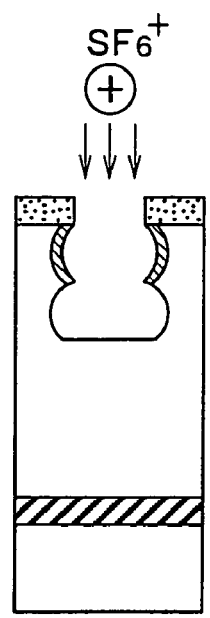
FIG. 17D  FIG. 17E
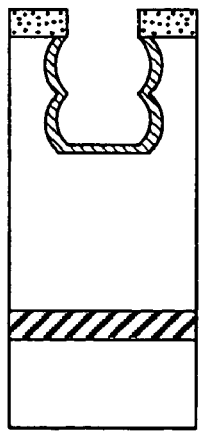
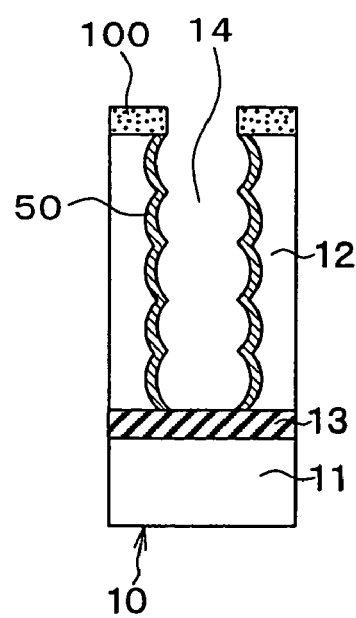

FIG. 18A
FIG. 18B
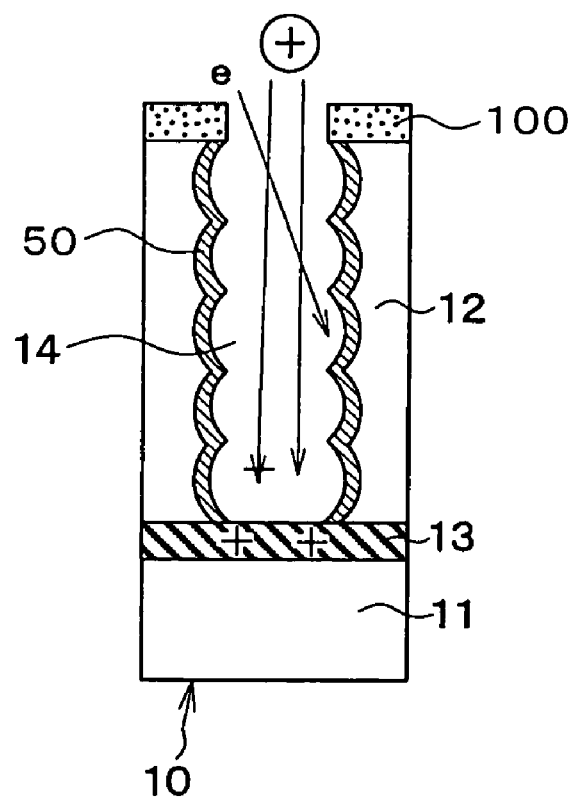
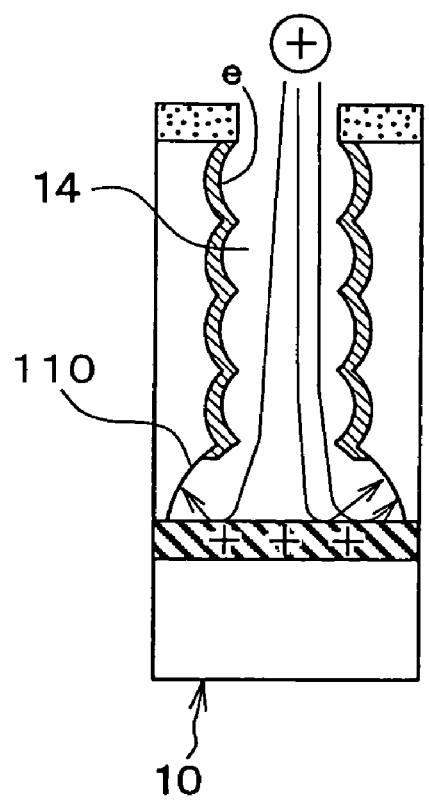

ically, a ## METHOD FOR MANUFACTURING MOVABLE PORTION OF SEMICONDUCTOR DEVICE

CROSS REFERENCE TO RELATED APPLICATIONS

This application is based on Japanese Patent Applications No. 2003-318267 filed on Sep. 10, 2003, and No. 2003-324586 filed on Sep. 17, 2003, the disclosures of which are incorporated herein by reference.

FIELD OF THE INVENTION

The present invention relates to a method for manufacturing a movable portion of a semiconductor device.

BACKGROUND OF THE INVENTION

A semiconductor device having a movable portion provides, for example, a physical quantity sensor. In the sensor, the movable portion is formed on a semiconductor substrate. The movable portion is movable in accordance with a physical quantity such as acceleration applied to the sensor. The sensor further includes a fixed portion. The fixed portion and the movable portion form a capacitor having an electrostatic capacitance, which is changeable in accordance with the displacement of the movable portion so that the physical quantity applied to the sensor is detected.

A method for forming a movable portion is disclosed in U.S. Pat. No. 6,399,516 and No. 6,365,056. In this method, the movable portion is formed by using a notching effect. Specifically, a semiconductor layer on an insulation layer in a substrate is over-etched in a reactive ion etching process so that the semiconductor layer is separated from the insulation layer. Thus, the movable portion is formed. In this case, a trench forming process for forming a trench on the semiconductor layer and a separation process for separating the semiconductor layer from the insulation layer are successively performed under the same etching condition. Therefore, control (i.e., etching condition) for controlling the separation process is merely provided by a control of an etching time. Thus, a form of a notch, i.e., a shape of the movable portion is not controlled precisely. Specifically, a gap between the movable portion and the insulation layer is not controlled.

Thus, the sensor has different movable portions having different gaps. However, it is preferred that the gap between the movable portion and the insulation layer is uniformed to obtain uniform sensor characteristics.

Further, in the separation process, a needle like protrusion may be formed on the inner wall of the trench, i.e., on the inner wall of the notch, which faces the insulation layer. The protrusion of the notch may be broken when a large impact is applied to the protrusion so that the protrusion crashes the insulation layer. The broken protrusion may cause a particle, and the particle may cause a problem, for example, short circuit when the sensor is operating.

Furthermore, when the etching condition of the trench etching process is optimized so that the trench is etched appropriately in a depth direction and a sidewall of the trench is strongly protected by a protection film. In this case, in the separation process for etching the sidewall of the trench to form the movable portion, the etching rate of the sidewall of the trench in the horizontal direction becomes smaller; and therefore, the etching time for separating the semiconductor layer from the insulation layer, i.e., the process time becomes longer. Thus, the manufacturing cost becomes larger.

SUMMARY OF THE INVENTION

In view of the above-described problem, it is an object of the present invention to provide a method for forming a movable portion of a semiconductor device having uniform movable portion. It is another object of the present invention to provide a method for forming a movable portion of a semiconductor device without any needle like protrusion, the method which has a short process time for forming the movable portion.

A method for manufacturing a semiconductor device having a movable portion includes the steps of: forming a trench on a semiconductor layer so that the trench reaches an insulation layer disposed under the semiconductor layer; and forming a movable portion by etching a sidewall of the trench disposed near the bottom of the trench in a direction parallel to the insulation layer so that the semiconductor layer is separated from the insulation layer. The steps of forming the trench and forming the movable portion are performed by a reactive ion etching method. The insulation layer disposed on the bottom of the trench is prevented from charging positively in the step of forming the trench. The insulation layer disposed on the bottom of the trench is charged positively in the step of forming the movable portion.

By using the above method, all of the trench can reach the insulation layer without forming the notch. Thus, the trench having different trench width and different etching rate can have a predetermined shape without forming the notch. Thus, the beginning of forming the notch on the inner wall of each trench is uniformed so that the gap between the bottom of the movable portion and the insulation layer can be uniformed. Thus, even if the width of the trench is different, each gap between the bottom of the movable portion and the insulation layer is uniformed. Accordingly, the method provides the semiconductor device having uniform movable portion. Specifically, the uniform movable portion has an uniformed gap between the movable portion and the insulation layer.

Further, in the above method, the protection effect in the separation process is comparatively weak so that the etching rate of the sidewall of the trench in the horizontal direction in the separation process is larger than that in the trench forming process. Therefore, the process time of the separation process becomes shorter. Further, the protection film formed in the separation process is easily removed by the etching in the horizontal direction in the separation process. Thus, the protection film on the inner wall of the trench is not partially remained so that no needle like protrusion on the inner wall of the notch is formed. Accordingly, the semiconductor device formed by the above method includes a movable portion without any needle like protrusion. Further, the process time of the method becomes shorter for forming the movable portion.

Preferably, the step of forming the trench is provided by a first etching condition, and the step of forming the movable portion is provided by a second etching condition. The first etching condition includes a bias electric field having a pulse-like oscillation with a first frequency in a range, in which a positive ion in the plasma is capable of following the bias electric field. The second etching condition includes another bias electric field having a continuous oscillation with a second frequency in a range, in which a positive ion in the plasma is not capable of following the bias electric field.

Preferably, the protection film formed in the deposition step in the step of forming the movable portion has a protection effect, which is comparatively weaker than that in the step of forming the trench.

Further, a method for manufacturing a semiconductor device includes the steps of: preparing a semiconductor substrate including an insulation layer and a semiconductor layer, wherein the insulation layer is disposed inside of the substrate, and the semiconductor layer is disposed on a surface of the substrate; forming a mask having a predetermined pattern on the semiconductor layer; forming a trench on the semiconductor layer by etching the semiconductor layer through the mask, wherein the trench is disposed from the surface of the semiconductor layer and reaches the insulation layer; and forming a movable portion by etching a sidewall of the trench disposed near the bottom of the trench in a direction parallel to the insulation layer so that the semiconductor layer is separated from the insulation layer. The step of forming the trench has a first etching condition, and the step of forming the movable portion has a second etching condition. The first etching condition in the step of forming the trench provides in such a manner that a sidewall of the trench disposed near the bottom is not etched in a case where the etching is continued after the bottom of the trench reaches the insulation layer. The second etching condition in the step of forming the movable portion provides in such a manner that the sidewall of the trench disposed near the bottom is etched in a case where the etching is continued after the bottom of the trench reaches the insulation layer.

By using the above method, all of the trench can reach the insulation layer without forming the notch. Thus, the trench having different trench width and different etching rate can have a predetermined shape without forming the notch. Thus, the beginning of forming the notch on the inner wall of each trench is uniformed so that the gap between the bottom of the movable portion and the insulation layer can be uniformed. Thus, even if the width of the trench is different, each gap between the bottom of the movable portion and the insulation layer is uniformed. Accordingly, the method provides the semiconductor device having uniform movable portion. Specifically, the uniform movable portion has an uniformed gap between the movable portion and the insulation layer.

Furthermore, a method for manufacturing a semiconductor device includes the steps of: preparing a semiconductor substrate including an insulation layer and a semiconductor layer, wherein the insulation layer is disposed inside of the substrate, and the semiconductor layer is disposed on a surface of the substrate; forming a mask having a predetermined pattern on the semiconductor layer; forming a trench on the semiconductor layer by etching the semiconductor layer through the mask, wherein the trench is disposed from the surface of the semiconductor layer and reaches the insulation layer; and forming a movable portion by etching a sidewall of the trench disposed near the bottom of the trench in a direction parallel to the insulation layer so that the semiconductor layer is separated from the insulation layer. The steps of forming the trench and the movable portion are performed by a reactive ion etching method such that the substrate is mounted in a vacuum chamber and a reactive gas is introduced into the chamber to become a plasma state. The reactive ion etching method is performed in such a manner that an etching step and a deposition step are alternately and repeatedly performed or simultaneously performed. The etching step is such that an etching gas in the plasma state etches the semiconductor layer. The deposition step is such that a deposition gas in the plasma state deposits a protection film on the inner wall of the trench. Each step of forming the trench and forming the movable portion includes a different etching condition so that a protection effect of the protection film in the step of forming the movable portion is comparatively weaker than that in the step of forming the trench.

In the above method, the protection effect in the separation process is comparatively weak so that the etching rate of the sidewall of the trench in the horizontal direction in the separation process is larger than that in the trench forming process. Therefore, the process time of the separation process becomes shorter. Further, the protection film formed in the separation process is easily removed by the etching in the horizontal direction in the separation process. Thus, the protection film on the inner wall of the trench is not partially remained so that no needle like protrusion on the inner wall of the notch is formed. Accordingly, the semiconductor device formed by the above method includes a movable portion without any needle like protrusion. Further, the process time of the method becomes shorter for forming the movable portion.

BRIEF DESCRIPTION OF THE DRAWINGS

The above and other objects, features and advantages of the present invention will become more apparent from the following detailed description made with reference to the accompanying drawings. In the drawings:

FIGS. 17A to 17E are cross sectional views explaining a method for manufacturing the sensor as a comparison, according to the fourth embodiment;

FIGS. 18A and 18B are cross sectional views explaining the method for manufacturing the sensor as a comparison, according to the fourth embodiment.

DETAILED DESCRIPTION OF THE PREFERRED EMBODIMENTS (First Embodiment)

The inventors have preliminarily studied about a method for forming a movable portion by using a notching effect.

Figure 7A:
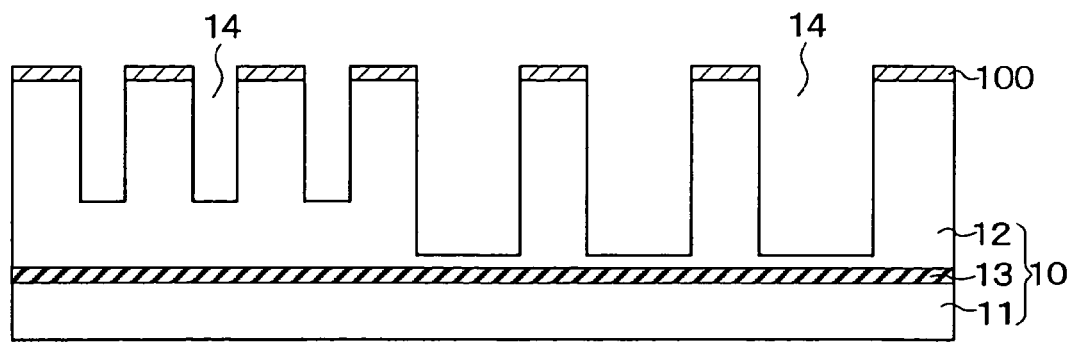
FIGS. 7A to 7C are cross sectional views explaining a method for manufacturing the sensor according to a comparison of the first embodiment.
Figure 7B:
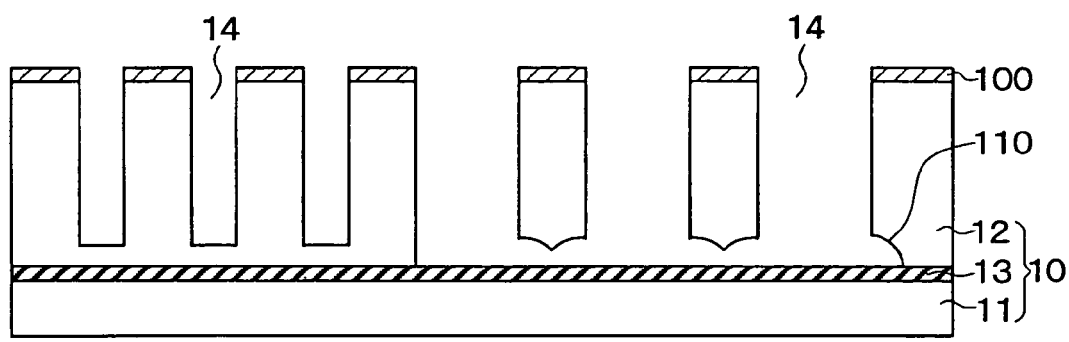
Figure 7C:
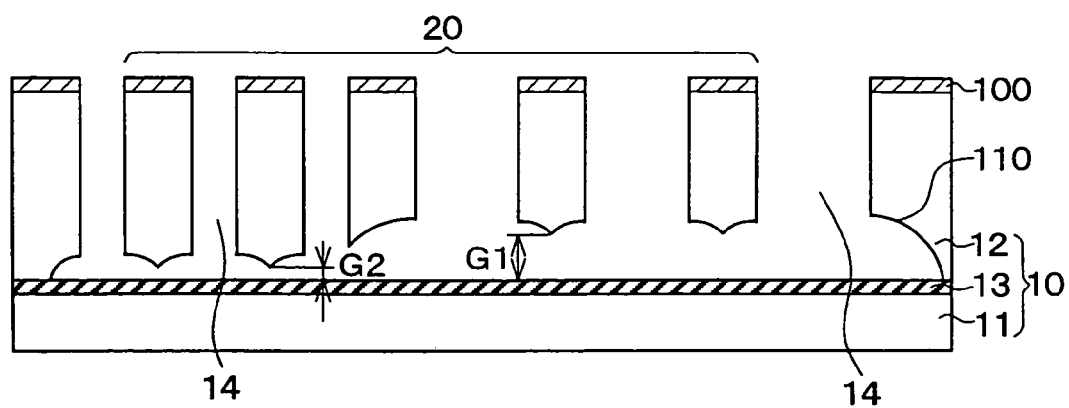

As shown in FIGS. 7A–7C, a semiconductor substrate 10 having semiconductor layers 11, 12 and an insulation layer 13 is formed by using the notching effect. The insulation layer 13 is disposed inside of the substrate 10, and the semiconductor layers 11, 12 are disposed on the surface of the substrate 10. The substrate 10 is a SOI (i.e., silicon on insulator) substrate, which includes the first silicon layer 11 as the first semiconductor layer, an embedded oxide layer 13 as an insulation layer and the second silicon layer 12 as the second semiconductor layer. The second silicon layer 12 is a SOI layer.

At first, a mask 100 is formed on the surface of the second silicon layer 12. The mask 100 has a predetermined pattern, which corresponds to a movable portion 20. This process is a mask-forming process. Then, the second silicon layer 12 is etched from the surface of the second silicon layer 12 so that a trench 14 is formed in the second silicon layer 12. The trench 14 reaches the embedded oxide layer 13. This process is a trench forming process. Successively, a sidewall of the trench 14 is etched in a horizontal direction, which is parallel to the embedded oxide layer. Specifically, a part of the second silicon layer 12, which is disposed on the bottom of the trench 14 and disposed in the horizontal direction, is etched. Thus, the second silicon layer 12 is removed from the embedded oxide layer 13 so that the movable portion 20 is formed. This process is a separation process. This manufacturing method including the trench forming process and the separation process is provided by a notching effect when the second silicon layer 12 is etched to form the trench 14 by using a reactive ion etching method.

The notching effect is such that the sidewall of the trench 14 near the embedded oxide layer 13 and disposed near the bottom of the trench 14 is locally etched in the horizontal direction in a case where the trench forming process is continued after the bottom of the trench 14 reaches the embedded oxide layer 13, i.e., in a case where the substrate 10 is over-etched. In the above method, the separation process is provided by this over-etching process, i.e., the notching effect. Specifically, a notch 110 is formed by the notching effect. The notch 110 is a local concavity on the sidewall of the trench 14, and the notch 110 becomes larger as it goes with time of the over-etching process.

Therefore, when neighboring two trenches 14 on the substrate 10 are over-etched so that the notches 110 are formed on each sidewall of the trenches 14, the second silicon layer 12 disposed between the neighboring trenches 14 is partially removed. This is, two notches 110 on both sides are connected. Specifically, the bottom portion of the second silicon layer 12 is etched so that the remained second silicon layer, which is an upper portion, is separated from the embedded oxide layer 13. Thus, the movable portion 20 is completed.

In the physical quantity sensor, the movable portion 20 includes a beam, a weight portion, a movable electrode, and the like, which have predetermined different shapes. Therefore, the mask 100 has a corresponding mask pattern, which corresponds to the movable portion, so that the mask 100 includes a wide trench 14 and a narrow trench 14, which are disposed in various ways. The wide trench 14 has a wide opening, and the narrow trench 14 has a narrow opening.

In general, the narrow trench 14 has a low etching rate lower than that of the wide trench 14. This is because a micro loading effect works during the reactive ion etching process. Therefore, in the trench forming process, the wide trench 14 reaches the embedded oxide layer 13 in first. After that, the narrow trench 14 reaches the embedded oxide layer 13. When the wide trench 14 reaches the embedded oxide layer 13, the notch 110 begins to form on the sidewall of the wide trench 14 firstly. Specifically, the notch 110 begins to form on the sidewall of the wide trench 14 before the narrow trench 14 reaches the embedded oxide layer 13.

Therefore, a part of the second silicon layer 12 sandwiched by the comparatively wide trenches 14 is rapidly separated from the embedded oxide layer 13, and another part of the second silicon layer 12 sandwiched by the comparatively narrow trenches 14 is slowly separated from the embedded oxide layer 13. The part of the second silicon layer 12 sandwiched by the comparatively wide trenches 14 is much over-etched by the notching effect so that the movable portion 20 corresponding to the part of the second silicon layer 12 sandwiched by the wide trenches 14 has a large gap G1 between the movable portion 20 and the embedded oxide layer 13. On the other hand, another movable portion 20 corresponding to the other part of the second silicon layer 12 sandwiched by the comparatively narrow trenches 14 has a small gap G2. Thus, the gaps G1, G2 between the movable portion 20 and the embedded oxide layer 13 have different distances between the movable portion 20 and the embedded oxide layer 13.

To form the movable portion 20 controllably, additional process condition for controlling the notching effect except for the etching time is provided in a method for forming the movable portion 20 according to a first embodiment of the present invention. Further, the trench forming process and the separation process are divided obviously so that each etching condition is optimized controllably. A detailed method for forming the movable portion is described as follows.

Figure 1:
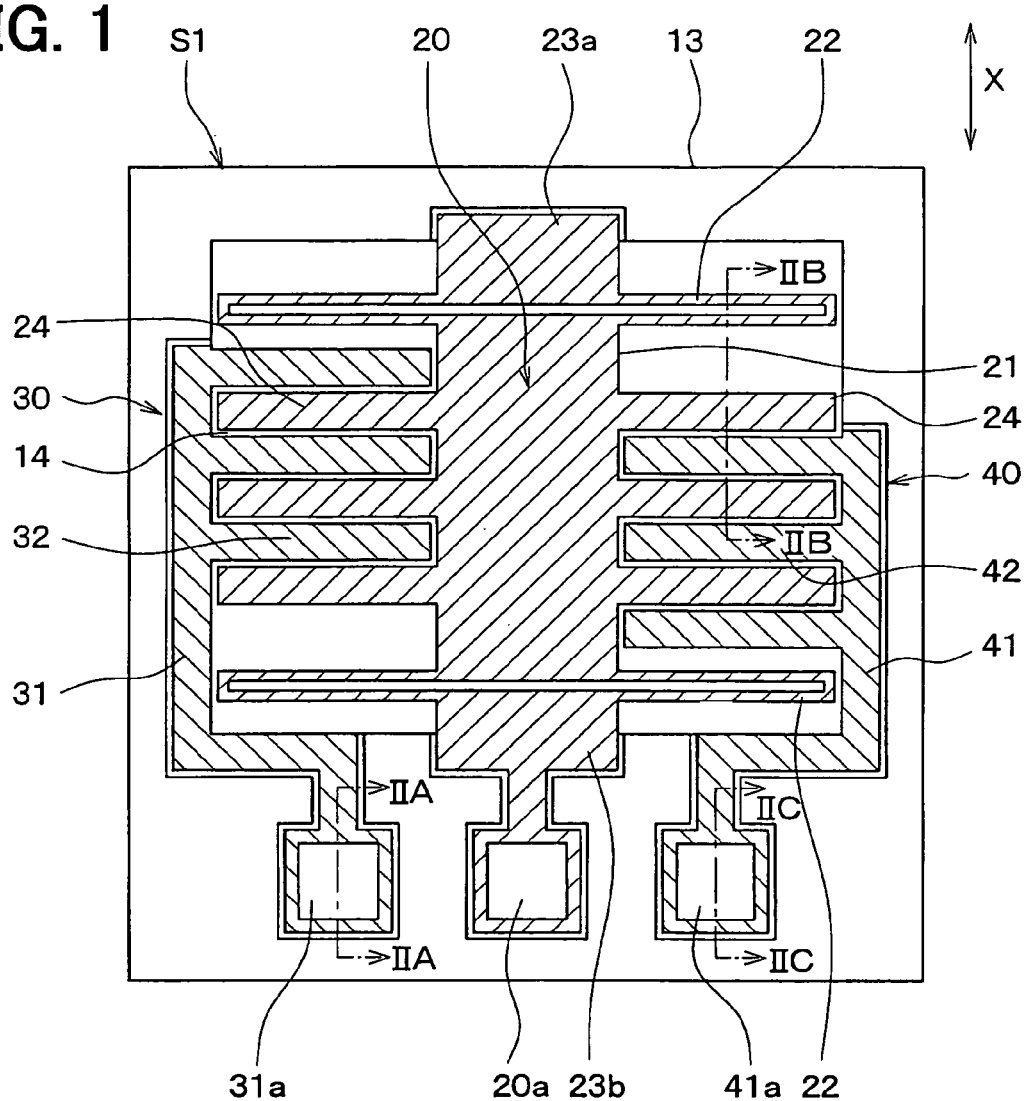
FIG. 1 is a plan view showing a semiconductor acceleration sensor according to a first embodiment of the present invention.
Figure 2:
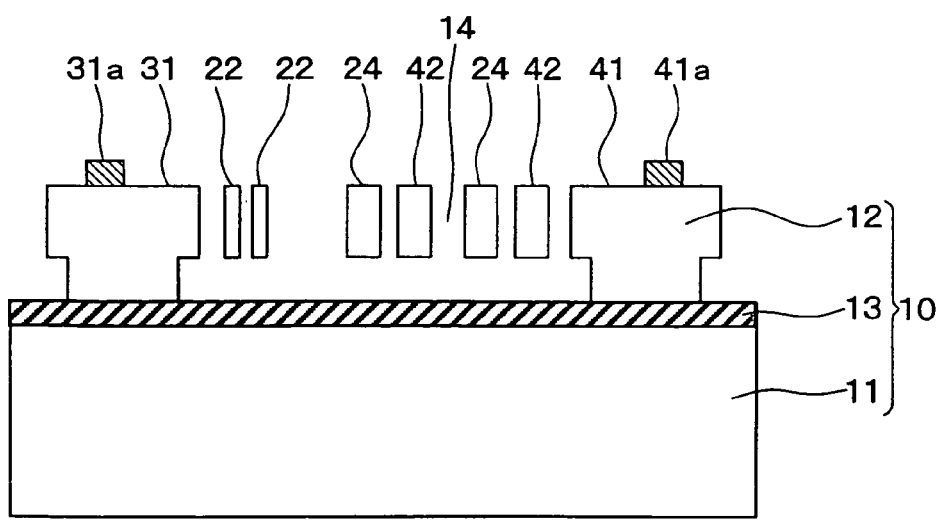
FIG. 2 is a synthesized cross sectional view showing the sensor taken along lines IIA, IIB and IIC.

FIGS. 1 and 2 show a semiconductor acceleration sensor S1 as a semiconductor device manufactured by a method according to the first embodiment. FIG. 2 is a partial cross sectional view synthesized by three cross sectional views showing three parts of the sensor S1 taken along lines IIA—IIA, IIB—IIB and IIC—IIC in FIG. 1. Although the semiconductor device S1 is the acceleration sensor S1, the semiconductor device S1 can be other devices as long as the device S1 has the movable portion 20, which is formed such that the trench 14 is formed on the semiconductor layer 12 of the substrate 10 including the insulation layer 13 disposed inside thereof, and the semiconductor layer 12 is separated from the insulation layer 12 so that the movable portion 20 is formed.

The sensor S1 is, for example, an acceleration sensor or a gyro sensor for controlling an airbag, ABS (i.e., antilockbreaking system), VSC (i.e., vehicle stability control) system or the like in an automotive vehicle. The sensor S1 includes a semiconductor substrate 10 having semiconductor layers 11, 12 and an insulation layer 13. The insulation layer 13 is disposed inside of the substrate 10, and the semiconductor layers 11, 12 are disposed on the surface of the substrate 10. The substrate 10 is a SOI (i.e., silicon on insulator) substrate, which includes the first silicon layer 11 as the first semiconductor layer, an embedded oxide layer 13 as an insulation layer and the second silicon layer 12 as the second semiconductor layer. The second silicon layer 12 is a SOI layer. The embedded oxide layer 13 is made of silicon oxide film. The substrate 10 has a rectangular shape.

A trench 14 is formed in the second silicon layer 12 so that a movable portion 20 and fixed portions 30, 40 are formed in the second silicon layer 12. The movable portion 20 and the fixed portions 30, 40 have a beam construction and a comb-teeth shape. The movable portion 20 includes a weight portion 21 and a spring portion 22. The weight portion 21 has a rectangular shape, and the spring portion 22 is disposed on both sides of the weight portion 21. The movable portion 20 is supported with a pair of anchors 23a, 23b through the spring portion 22.

The anchors 23a, 23b are fixed on the embedded oxide layer 13 disposed under the anchors 23a, 23b, as shown in FIG. 2. The movable portion 20, i.e., the weight portion 21 and the spring portion 22, disposed between the anchors 23a, 23b is separated from the embedded oxide layer 13. In the movable portion 20, the weight portion 21 and the spring portion 22 are suspended through the anchors 23a, 23b on the embedded oxide layer 13.

The spring portion 22 has a pair of beams, both ends of which are connected together, so that the two beams form a rectangular shape. The spring portion 22 is displaceable in a direction perpendicular to a longitudinal direction of the beam. This is, the spring portion 22 is movable in a direction X in FIG. 1. Therefore, when the sensor S1 is applied with acceleration in the direction X, the weight portion 21 is displaced in the direction X and the spring portion 22 is also displaced in the direction X. When the acceleration applied to the sensor S1 is disappeared, the spring portion 22 and the weight portion 21 are returned to a neutral position. Thus, the movable portion 20 is movable in the direction X in accordance with the application of the acceleration. In this case, the anchors 23a, 23b work as supporting points, i.e., fixed points of the movable portion 20.

The weight portion 21 includes multiple movable electrodes 24. Half of the movable electrodes 24 protrude from one side of the weight portion 21, and another half of the movable electrodes 24 protrude from the other side of the weight portion 21. The movable electrodes 24 are integrally protruded from the weight portion 21 in a direction perpendicular to the direction X, which is parallel to the displacement direction of the spring portion 22. Thus, the movable electrodes 24 protruded from both sides of the weight portion 21 oppositely provide a comb-teeth shape. In this embodiment, each of three movable electrodes 24 are protruded from right or left side of the weight portion 21. Each movable electrode 24 has a rectangular shaped cross section, and provides a beam. The movable electrode 24 is disposed apart from the embedded oxide layer 13. For example, a gap, i.e., a distance between the movable electrode 24 and the embedded oxide layer 13 is about a few microns.

Thus, the movable electrode 24 is integrally formed with the weight portion 21 and the spring portion 22 so that the movable electrode 24 is a part of the movable portion 20. The movable electrode 24 together with the weight portion 21 is displaceable in the displacement direction of the spring portion 22, which is parallel to the direction X.

Each fixed portion 30, 40 is disposed on each side of a pair of sides of the sensor S1. Here, the anchors 23a, 23b are disposed on another pair of sides of the sensor S1. Thus, the fixed portions 30, 40 are fixed on the embedded oxide layer 13. The fixed portions 30, 40 are disposed on both sides of the weight portion 21 so that the fixed portions 30, 40 sandwich the weight portion 21. The first fixed portion 30 is disposed on the left side of the weight portion 21, and the second weight portion 40 is disposed on the right side of the weight portion 21. The first and second fixed portions 30, 40 are electrically isolated each other. Each fixed portion 30, 40 includes a wiring portion 31, 41 and a fixed electrode 32, 42, respectively. Specifically, the first fixed portion 30 includes the first wiring portion 31 and the first fixed electrode 32, and the second fixed portion 40 includes the second wiring portion 41 and the second fixed electrode 42. The wiring portion 31, 41 is fixed on the embedded oxide layer 13 disposed under the wiring portion 31, 41 so that the wiring portion 31, 41 is supported on the first silicon layer 11 through the embedded oxide layer 13.

The fixed electrode 32, 42 is protruded from the wiring portion 31, 41 in the direction perpendicular to the direction X, which is parallel to the displacement direction of the spring portion 22 so that the fixed electrode 32, 42 faces the movable electrode 24. Further, the fixed electrode 32, 42 is protruded toward the weight portion 21 from the side of the wiring portion 31, 41 to have a comb-tooth shape. Thus, the fixed electrode 32, 42 engages the movable electrode 24 through a predetermined distance. In this embodiment, three fixed electrodes 32, 42 are integrally formed to connect to the wiring portion 31, 41.

Each fixed electrode 32, 42 has a rectangular shaped cross section, and provides a beam so that the fixed electrode 32, 42 is cantilevered on the wiring portion 31, 41. Thus, the fixed electrode 31, 41 is separated from the embedded oxide layer 13. For example, the fixed electrode 31, 41 is disposed apart from the embedded oxide layer 13 by a few microns. The side of the fixed electrode 32, 42 faces the side of the corresponding movable electrode 24 with a predetermined distance, which is a detection distance between the fixed and movable electrodes 24, 32, 42. A fixed electrode pad 31a, 41a is formed on each wiring portion 31, 41 of the fixed portion 30, 40. The fixed electrode pad 31a, 41a connects to an external circuit by a wire bonding method. A movable electrode pad 20a is formed on one of the anchors 23b. The movable electrode pad 20a connects to the external circuit by the wire bonding method. The fixed and movable electrode pads 20a, 31a, 41a are made of aluminum or the like. The sensor S1 is mounted on a package (not shown). Specifically, the backside surface of the first silicon layer 11, which is opposite to the embedded oxide layer 13, is bonded to the package through adhesive or the like. The package includes the external circuit so that the external circuit electrically connects to the fixed and movable electrode pads 20a, 31a, 41a through a gold wire or an aluminum wire formed by the wire bonding method.

Here, the first fixed electrode 32 and the movable electrode 24 form the first capacitor having the first capacitance CS1, and the second fixed electrode 42 and the movable electrode 24 form the second capacitor having the second capacitance CS2. When the acceleration is applied to the sensor S1, the movable portion 20 is integrally displaced with the weight portion 21 in the direction X because of the spring characteristic of the spring portion 22. Here, the anchor 23a, 23b works as a support point. Then, the distance between the first or second fixed electrode 32, 42 and the movable electrode 24 is changed in accordance with the displacement of the movable electrode 24 so that the first and second capacitances CS1, CS2 are changed in accordance with the distance change. On the basis of a difference between the first and second of capacitances CS1, CS2 (i.e., CS1–CS2), the acceleration applied to the sensor S1 in the direction X is detected.

Figure 3:
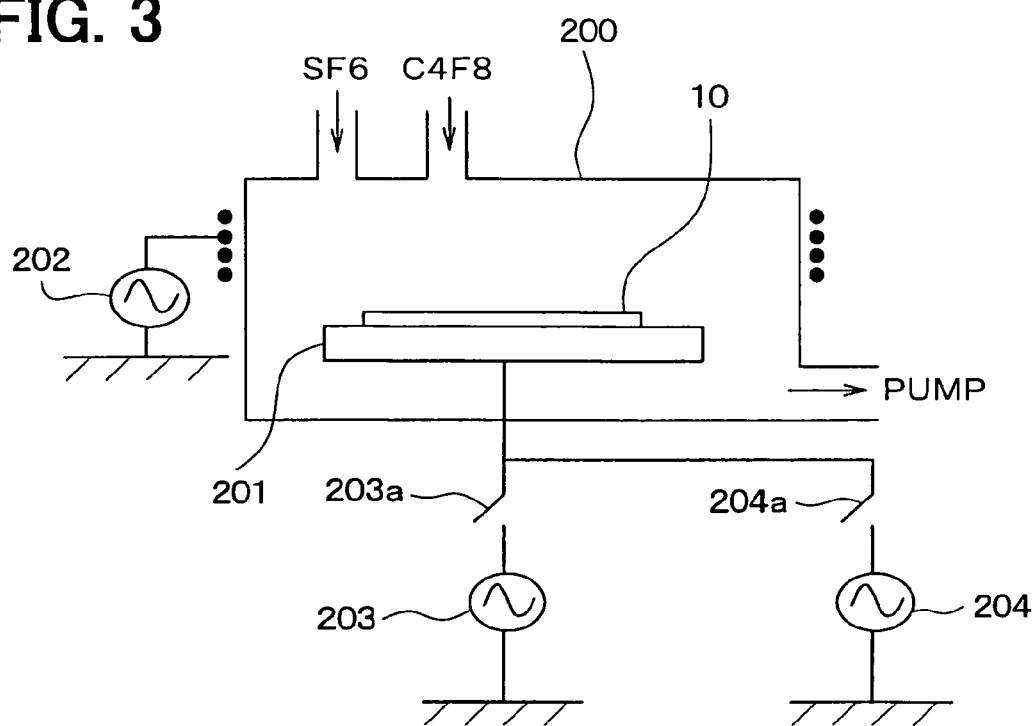
FIG. 3 is a schematic view showing reactive ion etching equipment, according to the first embodiment.

The above acceleration sensor S1 is manufactured as follows. FIGS. 3 and 4 explain a method for manufacturing the sensor S1 according to the first embodiment. The reactive ion etching equipment is shown in FIG. 3. FIG. 4 explains each process of the method. FIG. 4 does not correspond to FIG. 2, and is a schematic cross sectional view showing the movable portion 20.

Figure 4A:
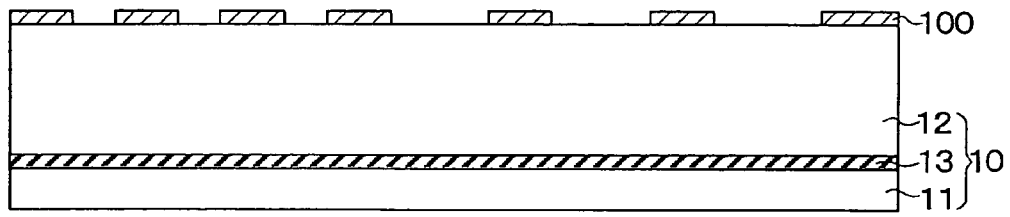
FIGS. 4A to 4E are cross sectional views explaining a method for manufacturing the sensor according to the first embodiment.

At first, the substrate 10 having the first and second silicon layers 11, 12 and the embedded oxide layer 13 is prepared, as shown in FIG. 4A. The substrate 10 is processed in the trench forming process and the separation process by using the reactive ion etching equipment shown in FIG. 3. In general, the sensor S1 is formed from a semiconductor wafer. Specifically, the sensor S1 is obtained as a chip diced from the wafer having multiple chips. In this embodiment, the wafer is processed in the mask forming process, the trench forming process and the separation process, and then, the wafer is diced into multiple chips. Thus, the sensor S1 is formed.

The reactive ion etching equipment includes a vacuum chamber 200 with a holder 201. The wafer, i.e., the substrate 10 is mounted on the holder 201. Then, a reactive gas is introduced into the chamber 200 so that the reactive gas becomes a plasma state. An etching gas as the reactive gas such as SF6 gas (i.e., sulfur hexafluoride gas) or the like and a depositing gas as the other reactive gas such as C4F8 gas (i.e., octafluoro-2-butene gas) or the like are alternately introduced into the chamber 200. The reactive gas and the like, i.e., gases are evacuated from the chamber 200 by a vacuum pump so that the pressure in the chamber 200, i.e., a chamber pressure is held at a predetermined constant pressure.

The equipment includes two types of RF (i.e., radio frequency) power supplies 202, 203, 204. One is the RF power supply 202 for generating plasma (i.e., the plasma generating RF power supply). The other is the RF power supply 203, 204 for applying a bias electric field (i.e., the bias electric field RF power supply). The RF power supply 202 generates plasma in the chamber 200 so that the reactive gas introduced into the chamber 200 becomes the plasma state. The RF power supplies 203, 204 apply the bias electric field to the substrate 10 mounted in the chamber 200 so that a reactive ion in the plasma is accelerated toward the substrate 10. Thus, the substrate 10 is irradiated with the reactive ion so that the substrate is etched by the ion.

Thus, the substrate 10 is etched by the reactive ion etching method. In the reactive ion etching process, an etching step for etching the substrate 10 and a protection film depositing step (i.e., deposition step) for depositing a protection film, i.e., a passivation film on the substrate 10 are alternately performed. In the etching step, the etching gas in the plasma state etches the second semiconductor layer 12 as the second silicon layer. In the protection film depositing step, the protection film is deposited on the inner wall of the trench 14 by using the depositing gas in the plasma state. The protection film protects the inner wall of the trench 14 from being etched. For example, the SF6 gas in the plasma state, i.e., the SF6 plasma etches the second semiconductor layer 12 so that the etching step is performed. The C4F8 gas in the plasma state, i.e., the C4F8 plasma deposits the protection film on the inner wall of the trench 14 so that the deposition step is performed. Thus, the protection film is deposited on the inner wall of the trench 14, and then, the bottom of the trench 14 is etched in a depth direction. These steps are repeated during the reactive ion etching process.

Here, in the method for forming the movable portion 20 shown in FIGS. 7A to 7C, even when the bottom of some trenches 14 reaches the embedded oxide layer 13, the ion etching process continues to perform. In this case, the surface of the embedded oxide layer 13 charges positively. Thus, in the step of etching the second semiconductor layer 12 of the method shown in FIGS. 14A to 7C, an etching ion, i.e., a positive ion irradiating toward the substrate 10 and the positively charged surface of the embedded oxide layer 13 electrically repels each other so that the irradiating direction of the positive ion bents. Then, the positive ion turns toward the inner wall of the trench 14. Thus, the inner wall of the trench 14 is etched by the etching ion so that a notch 110 is formed on the inner wall of the trench 14. Accordingly, after the surface of the embedded oxide layer 13 is exposed from the second semiconductor layer 12, the inner wall of the trench 14 is etched so that a part of the second semiconductor layer, which is to be the movable portion 20, is separated from the embedded oxide layer 13. Thus, the inner wall of each trench 14 individually begins to be etched in the separation process at a different beginning time. This is, the beginning of the separation process of each trench 14 is different each other.

Here, a method for suppressing the notching effect is disclosed in U.S. Pat. No. 6,187,685. In this method, a RF power supply for applying a bias electric field generates a low frequency field having a low frequency of, for example, 380 kHz, which is much lower than a conventional frequency of, for example, 13.56 MHz. Thus, the RF power supply generates pulse-like electric field. Here, the positive ion in the reactive gas plasma can follow the low frequency electric field. This pulse-like low frequency electric field applied by the RF power supply for generating the bias electric field can suppress the positive discharge on the embedded oxide layer 13, which is a factor of the notching effect. Thus, the notching effect is reduced so that the inner wall of the trench 14 disposed near the bottom of the trench 14 is not etched. On the other hand, when the embedded oxide layer 13 is charged positively so that the inner wall of the trench 14 is etched by using the notching effect, the RF power supply for applying the bias electric field generates the conventional electric field having the conventional frequency of, for example, 13.56 MHz. In this case, the bias electric field is continuously applied to the substrate 10.

In this embodiment, the frequency and the oscillation condition of the RF power supply 203, 204 for applying the bias electric field is switched between the trench forming process and the separation process. Specifically, the reactive ion etching equipment includes two RF power supplies 203, 204 for applying the bias electric field. The first RF power supply 203 for applying the bias electric field generates the electric field having the low frequency of 380 kHz so that the first RF power supply 203 generates the pulse-like bias electric field. The first RF power supply 203 is used in the trench forming process. Here, the pulse-like bias electric field is such that the low frequency RF electric power is applied to the substrate 10 just like a pulse electric field. The second RF power supply 204 for applying the bias electric field generates the electric field having the conventional frequency of 13.56 MHz so that the second RF power supply 204 continuously generates the bias electric field. The second RF power supply 204 is used in the separation process. Here, the continuous bias electric field is such that the RF electric power is continuously applied to the substrate 10. The first and second RF power supplies 203, 204 are switched by turning on and off switches 203a, 204a.

The method for forming the movable portion 20 in the sensor S1 is performed as follows.

Firstly, as shown in FIG. 4A, a mask 100 having a predetermined pattern is formed on the second semiconductor layer 12. The predetermined pattern corresponds to the movable portion 20 and the fixed portion 30. This is a mask forming process. Specifically, the predetermined pattern of the mask 100 corresponds to a planer pattern of the second semiconductor layer 12 of the sensor S1 shown in FIG. 1. The opening of the mask 100 corresponds to the trench 14 of the sensor S1. Here, the mask 100 is formed on the semiconductor wafer including the substrate 10 in the mask forming process. The mask 100 is made of, for example, a conventional photo resist such as photo curable resin or thermosetting resin. The substrate 10 with the mask 100 is mounted on the holder 201 in the chamber 200.

Figure 4B:
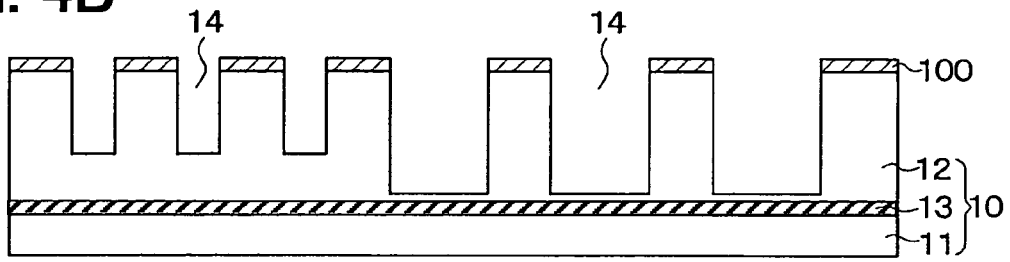
Figure 4C:
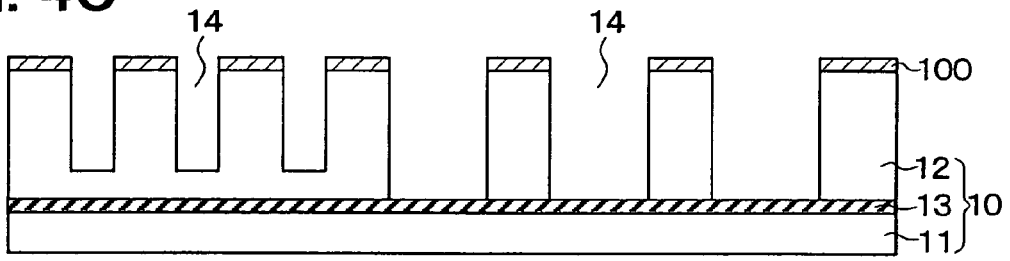
Figure 4D:
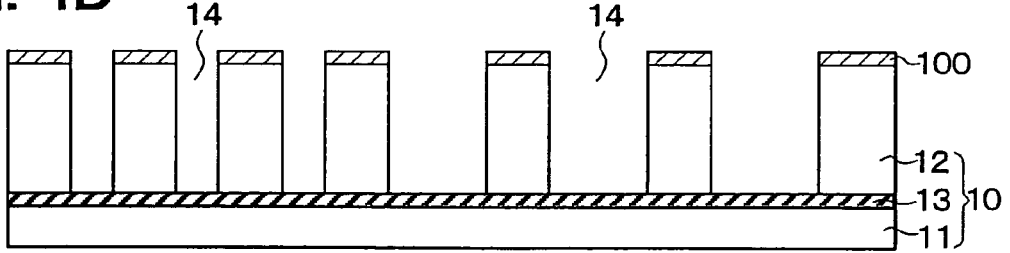
Figure 4E:
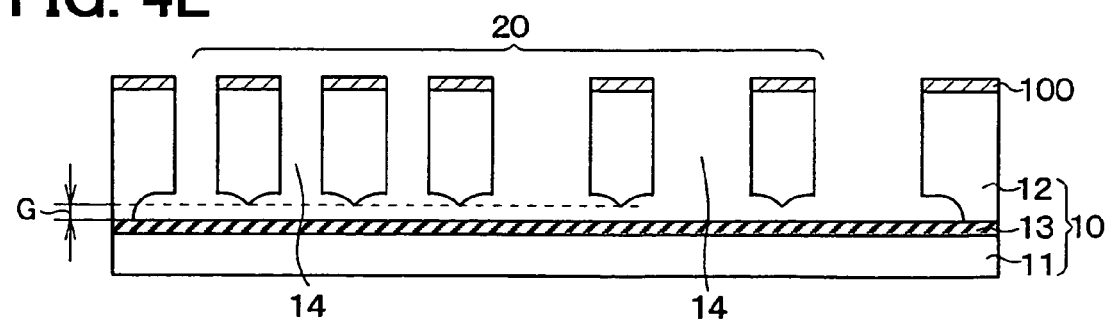

Next, as shown in FIGS. 4B to 4D, the second semiconductor layer 12 is etched from the surface of the second silicon layer 12 so that the trench 14 is formed to reach the embedded oxide layer 13. This is a trench forming process. In the trench forming process, the first switch 203a turns on, and the second switch 204a turns off. Therefore, the RF power supply 203 for applying the pulse-like bias electric field is used for etching the second semiconductor layer 12. During the trench etching process, the RF power supply 202 for generating the plasma having the oscillation frequency of 13.56 MHz applies the continuous oscillation so that the plasma in the chamber 200 is produced. Accordingly, even if the bottom of some trenches 14 reaches the embedded oxide layer 13 so that the embedded oxide layer 13 is exposed from the second semiconductor layer 12, the exposed surface of the embedded oxide layer 13 is prevented from charging positively. Thus, the notching effect is suppressed so that the inner wall of the trench 14 disposed near the bottom of the trench 14 is not partially etched.

In the trench forming process, the etching is performed during sufficient time so that all of the trenches 14 corresponding to the opening of the mask 100 reach the surface of the embedded oxide layer 13. At this time, since the notching effect is suppressed, the inner wall of the trench 14 is not etched even when the bottom of the trench 14 reaches the embedded oxide layer 13. Then, the bottom of the trench 14 having comparatively small etching rate reaches the embedded oxide layer 13. As shown in FIGS. 4C and 4D, the bottom of the trench 14 having comparatively wide width reaches the embedded oxide layer 13 firstly. Then, the bottom of the trench 14 having comparatively narrow width reaches the embedded oxide layer 13. This is, the trench 14 having the wide width is etched faster than that having the narrow width because of the micro loading effect.

Even when the bottom of the trench 14 having the narrow width reaches the surface of the embedded oxide layer 13, the inner wall of the trench 14 having the wide width has no notch 110 so that the trench 14 having the wide width keeps it's shape. The trench forming process is ended after all of the bottoms of the trenches 14 reach the surface of the embedded oxide layer 13 so that the embedded oxide layer 13 disposed at all of the openings of the mask 100 is exposed from the second semiconductor layer 12. Here, the trench forming process can be ended after at least some of the bottoms of the trenches 14 for defining the movable portion 20 reach the surface of the embedded oxide layer 13 so that the embedded oxide layer 13 disposed at some of the openings of the mask 100 is exposed from the second semiconductor layer 12. Specifically, the process can be ended after some of the trenches 14 corresponding to the movable portion 20 reach the embedded oxide layer 13.

The decision of etching time when all of the bottoms of the trenches 14 reach the surface of the embedded oxide layer 13 is determined by calculating the time on the basis of the etching rate of the second semiconductor layer 12 disposed at the opening of the mask 100 and the thickness of the second semiconductor layer 12.

Further, the decision of etching time can be determined by a detection of emission spectrum emitted from the plasma. Specifically, the decision can be determined on the basis of a strength change of a predetermined peak in the emission spectrum or a strength change of all emission. This detection is performed such that a window is formed on the chamber 200, and a detector for detecting the emission spectrum is installed on the window. The detector detects emission lights from the chamber 200. In the chamber 200, the plasma of the reactive gas emits lights. When the embedded oxide layer 13 is exposed from the second semiconductor layer 12, the strength of the predetermined peak and/or the strength of all lights emitted from the plasma are changed, compared with those when the second semiconductor layer 12 is etched to form the trench 14. Therefore, the decision of etching time when all of the embedded oxide layers 13 are exposed from the second semiconductor layer 12 can be determined by detecting the strength change with the detector through the window of the chamber 200.

Furthermore, the decision of etching time can be determined by an observation of interference fringes of the bottom of the trench 14. The observation of interference fringes is performed with a monitor for monitoring the bottom of the trench 14, which is being formed in the trench forming process. When all of the embedded oxide layers 13 are exposed from the second semiconductor layer 12, the interference fringes at the bottom of the trench 14 are disappeared. This observation is performed such that a window is formed on the chamber 200, and the monitor for observing the surface of the semiconductor wafer is installed on the window. At this time, when the bottom of the trench 14 approaches the surface of the embedded oxide layer 13, the interference fringes are appeared because the part of the second semiconductor layer disposed between the bottom of the trench 14 and the surface of the embedded oxide layer 13 becomes thin. After the bottom of the trench 14 reaches the surface of the embedded oxide layer 13, the interference fringes are disappeared. Thus, the decision of the etching time is determined.

Next, the separation process for forming the movable portion 20 is performed by switching the etching condition. In the separation process, the inner wall of the second semiconductor layer 12 disposed near the bottom of the trench 14 is etched in the horizontal direction. Thus, the second semiconductor layer 12 is separated from the embedded oxide layer 13 so that the movable portion 20 is formed. Specifically, the first switch 203a turns off, and the second switch 204a turns on. Thus, the first RF power supply 203 is switched to the second RF power supply 204. During the separation process, the RF power supply 202 for generating the plasma having the oscillation frequency of 13.56 MHz applies the continuous oscillation so that the plasma in the chamber 200 is produced. Thus, after the trench forming process is ended, the switches 210a, 211a are operated and other etching conditions are optimized. Then, the etching, i.e., over-etching the inner wall of the trench 14 in the separation process is re-started. At this time, the notching effect is not suppressed so that the notch 110 is formed on the inner wall of the trench 14 disposed near the bottom of the trench 14. The notch 110 becomes larger as the etching continues. Then, one notch 110 on the inner wall of one trench 14 connects to another notch 110 on the other inner wall of the other trench 14, which is opposite to the one trench 14. The neighboring two trenches 14 are connected each other so that the second semiconductor layer as the movable portion 20 is separated from the embedded oxide layer 13.

Further, the etching is continued so that a gap G between the bottom of the second semiconductor layer 12, i.e., the bottom of the movable portion 20 and the embedded oxide layer 13 becomes wider. When the gap G becomes a predetermined gap, for example, a few microns, the etching is ended. Thus, the separation process is completed so that each gap G between the movable portion 20 and the embedded oxide layer 13 is uniformed and has a predetermined width. Further, a wire bonding process and the like are performed so that the sensor S1 is completed.

The method according to the first embodiment has following characteristics.

(1) The trench forming process and the separation process are independently preformed so that two process have different etching conditions.

(2) In the trench forming process, even when the etching is continued after the bottom of some trenches 14 reach the embedded oxide layer 13, the inner wall of the trench 14 disposed near the bottom of the trench 14 is not etched.

(3) In the separation process, the inner wall of the trench 14 disposed near the bottom of the trench 14 is etched.

Accordingly, in the trench forming process, the bottom of the trench 14 having the comparatively wide width reaches the embedded oxide layer 13 firstly. Then, to form the trench 14 having the narrow width, the etching is continued. In this case, the inner wall of the trench having the comparatively wide width is not etched in the horizontal direction. Accordingly, all of the trench 14 can reach the embedded oxide layer 13 without forming the notch 110. Thus, the trench 14 having different trench width and different etching rate can have a predetermined shape without forming the notch 110 on the inner wall thereof.

After that, in the separation process, the inner wall of the trench 14 disposed near the bottom of the trench 14 is etched, i.e., the notch 110 is formed on the inner wall of the trench 14 so that the movable portion 20 is formed by separating the second semiconductor layer 12 from the embedded oxide layer 13. Here, after almost all of the trenches 14 having different trench width and different etching rate reach the embedded oxide layer 13, the etching of the separation process begins to perform. Therefore, the notch 110 is formed on the inner walls of almost all of the trenches 14 at the same time. Thus, the beginning of forming the notch 110 on each inner wall is uniformed. Thus, the gap G between the bottom of the movable portion 20 and the embedded oxide layer 13 can be uniformed after the separation process is ended. Thus, even if the width of the trench 14 is different, each gap G between the bottom of the movable portion 20 and the embedded oxide layer 13 is uniformed. Each gap G is disposed in an area where all of the movable portions are disposed.

Further, after the embedded oxide layer 13 is exposed from all of the openings of the mask 100 in the semiconductor wafer, the trench etching process is switched to the separation process. Therefore, the beginning of the etching of the separation process is uniformed in the wafer. Thus, even if the etching rate of the trench 14 is different, all of the trenches 14 can reach the embedded oxide layer 13 without forming the notch 110. Accordingly, all of the trenches 14 are formed to have a predetermined shape. Further, each gap G between the bottom of the movable portion 20 and the embedded oxide layer 13 is uniformed. The gap G is disposed in all area of the semiconductor wafer.

Furthermore, after the embedded oxide layer 13 is exposed from a part of the openings of the mask 100, the part of the openings defining the movable portion 20, the trench forming process can be switched to the separation process. This is, after the bottoms of a part of the trenches 14 defining the movable portion 20 reach the embedded oxide layer 13, the trench forming process can be switched to the separation process. In this case, the gap G between the movable portion 20 and the embedded oxide layer 13 can be uniformed.

The trench forming process and the separation process are performed by the reactive ion etching method. In the trench forming process, the etching is performed such that the surface of the embedded oxide layer 13 disposed on the bottom of the trench 14 is prevented from charging positively. Therefore, the inner wall of the trench 14 near the bottom of the trench 14 is not etched. In the separation process, the etching is performed such that the surface of the embedded oxide layer 13 disposed on the bottom of the trench 14 is charged positively. Therefore, the inner wall of the trench 14 near the bottom of the trench 14 is etched so that the notch 110 is formed. These etching conditions are controlled by switching the first and second RF power supplies 203, 204.

In the trench forming process, the first RF power supply 203 generates a low frequency electric field having a low frequency disposed in a range, in which the positive ion in the plasma is capable of following the oscillation of the electric field. Further, the first RF power supply 203 generates the pulse-like electric field. Thus, in the trench forming process, the embedded oxide layer 13 disposed on the bottom of the trench 14 is prevented from charging positively. In the separation process, the second RF power supply 204 generates a high frequency electric field having a high frequency disposed in a range, in which the positive ion in the plasma is not capable of following the oscillation of the electric field. Thus, in the separation process, the embedded oxide layer 13 disposed on the bottom of the trench 14 is charged positively.

Although the low frequency is set to be 380 kHz, and the high frequency is set to be 13.56 MHz, the low and high frequencies can be set to other frequencies. The range of the low frequency, in which the positive ion in the plasma is capable of following the oscillation of the electric field, is equal to or lower than 600 kHz. The range of the high frequency, in which the positive ion in the plasma is not capable of following the oscillation of the electric field, is equal to or higher than 600 kHz.

The reactive ion etching equipment includes two RF power supplies 203, 204 for applying the bias electric field so that they are switched by the switches 203a, 204a. Therefore, The trench forming process and the separation process can be performed successively without removing the substrate 10, i.e., the wafer from the chamber 200. The equipment can have two chambers. One is the first chamber having the RF power supply 202 for generating plasma and the first RF power supply 203 for applying the low frequency bias electric field in the trench forming process. The other is the second chamber having the RF power supply 202 for generating plasma and the second RF power supply 204 for applying the high frequency bias electric field in the separation process. In this case, the substrate 10 is transferred from the first chamber to the second chamber after the trench forming process is ended so that the separation process begins.

Each of the trench forming process and the separation process can have individual etching condition, respectively. For example, the etching condition are a RF power for generating plasma, another RF power for applying the bias electric field, a gas flow rate, a time ratio between the etching step and the deposition step of the protection film, an acceleration voltage of the etching ion, a ratio between an amount of deposition of the protection film per one cycle and an amount of etching per one cycle and the like. These parameters of the etching condition are optimized in each process. For example, the etching condition for forming the trench 14 having a vertical sidewall in the trench forming process may not coincide with the etching condition for forming the movable portion 20 having the optimum gap between the bottom of the movable portion 20 and the embedded oxide layer 13. If the etching conditions of the trench forming process and the separation process are the same, the gap may not be optimized or the cross section of the trench 14 may become tapered shape. Therefore, the etching conditions of the trench forming process and the separation process are controlled individually so that the trench 14 has the vertical sidewall and the gap is optimized.

Although the sensor S1 is an acceleration sensor, the sensor S1 can be another sensor having a movable portion such as a semiconductor gyro sensor, a semiconductor pressure sensor, a semiconductor gas sensor, a semiconductor gas flow sensor, an infrared light sensor, or a semiconductor humidity sensor.

(Second Embodiment)

In a second embodiment of the present invention, the charging of the embedded oxide layer 13 is controlled such that the frequency and the oscillation state of the RF power supply 202 for generating plasma and the RF power supplies 203, 204 for applying the bias electric field are controlled.

Here, a method for controlling the notching effect is disclosed in Japanese Patent Application Publication No. H08-181125. In this method, a microwave is introduced into a vacuum chamber so that a reactive gas becomes a plasma state. The plasma in the chamber is stabilized by a magnetic field generated by a coil disposed around the chamber. In this case, the microwave is modulated into a pulse-like microwave, so that the plasma having a positive ion and a negative ion of an etching gas is produced. A RF power supply for applying a bias electric field applies the bias electric field as a substrate bias electric field to a substrate. Here, the bias electric field has a frequency in a range where the positive and negative ions are capable of following the electric field. For example, the frequency of the bias electric field is equal to or lower than 600 kHz. In this case, the charging of an embedded oxide layer is suppressed.

Figure 5:
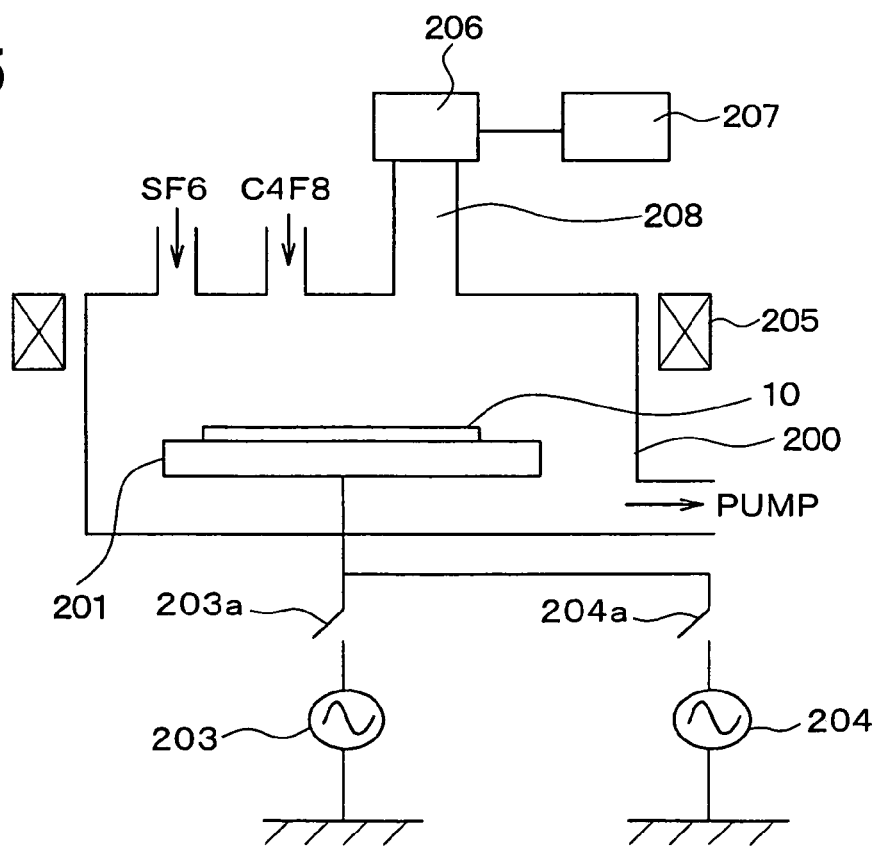
FIG. 5 is a schematic view showing reactive ion etching equipment, according to a second embodiment of the present invention.

In view of the above knowledge, reactive ion etching equipment for forming a movable portion according to a second embodiment of the present invention is shown in FIG. 5. The equipment includes a coil 205 disposed around the chamber 200. The coil 205 generates a magnetic field for stably enclosing (i.e., trapping) the plasma in the chamber 200. The equipment further includes a RF power supply 206 for generating plasma as a microwave generator. The RF power supply 206 has a pulse generating circuit 207. A waveguide tube 208 is disposed between the RF power supply 206 and the chamber 200. The waveguide tube 208 introduces the microwave into the chamber 200.

The RF power supply 206 continuously generates a RF electric field having a frequency about a few GHz. Further, by using the pulse generating circuit 207, the RF power supply 206 generates a pulse-like RF electric field. In this embodiment, in the trench forming process, the pulse-like electric field is generated, and in the separation process, the continuous electric field is generated. Thus, the oscillation state can be switched. The equipment further includes the first and second RF power supplies 203, 204 for applying the bias electric field to the substrate 10. The first RF power supply 203 generates a pulse-like bias electric field having frequency of 400 kHz, and is used in the trench forming process. The second RF power supply 204 generates a continuous bias electric field having frequency of 13.56 MHz, and is used in the separation process. These two RF power supplies 203, 204 are switched by turning the switches 203a, 204a on and off.

A method for manufacturing the sensor S1 according to the second embodiment is described as follows. The mask 100 is formed on the substrate 10, as shown in FIG. 4A. Then, the substrate 10, i.e., the wafer is mounted on the holder 201 in the chamber 200 shown in FIG. 5. In the trench forming process, the RF power supply 206 for generating plasma generates a pulse-like oscillation, and the first RF power supply 203 applies a low frequency bias electric field having a low frequency disposed in a range, in which the positive ion in the plasma is capable of following the oscillation of the electric field.

Specifically, the RF power supply 206 for generating plasma with the pulse generating circuit 207 generates a pulse-like oscillation having a frequency of a few kHz, i.e., having a few millisecond pulse. The switch 203a turns on, and the switch 204a turns off so that the first RF power supply 203 generates a pulse-like oscillation having a frequency of 400 kHz. In this etching condition, the charging of the embedded oxide layer 13 disposed on the bottom of the trench 14 is reduced. Even if the bottom of some trenches 14 reaches the embedded oxide layer 13 so that the embedded oxide layer 13 is exposed from the second semiconductor layer 12, the exposed surface of the embedded oxide layer 13 is prevented from charging positively. Thus, the notching effect is suppressed so that the inner wall of the trench 14 disposed near the bottom of the trench 14 is not partially etched in a case where the etching is continued after the bottom of the trenches 14 reaches the embedded oxide layer 13.

After the trench forming process is ended, the etching condition is switched so that the separation process is performed. In the separation process, the RF power supply 206 for generating plasma generates a continuous oscillation, and the second RF power supply 204 applies a high frequency bias electric field having a high frequency disposed in a range, in which the positive ion in the plasma is not capable of following the oscillation of the electric field.

Specifically, the RF power supply 206 for generating plasma without modulating the microwave by the pulse generating circuit 207 generates a continuous oscillation having a frequency of a few GHz. The switch 203a turns off, and the switch 204a turns on so that the second RF power supply 204 generates a continuous oscillation having a frequency of 13.56 MHz. In this etching condition, the embedded oxide layer 13 disposed on the bottom of the trench 14 is charged positively. Thus, the sidewall of the trench 14 disposed near the bottom of the trench 14 is etched locally. Accordingly, the notch 110 is formed on the sidewall of the trench 14. The notch 14 becomes larger as the etching continues. Then, one notch 110 on the inner wall of one trench 14 connects to another notch 110 on the other inner wall of the other trench 14, which is opposite to the one trench 14. The neighboring two trenches 14 are connected each other so that the second semiconductor layer 12 as the movable portion 20 is separated from the embedded oxide layer 13. Thus, the sensor S1 having the uniform gap between the movable portion 20 and the embedded oxide layer 13 is completed.

Although the low frequency is set to be 400 kHz, and the high frequency is set to be 13.56 MHz, the low and high frequencies can be set to other frequencies. The range of the low frequency, in which the positive ion in the plasma is capable of following the oscillation of the electric field, is equal to or lower than 600 kHz. The range of the high frequency, in which the positive ion in the plasma is not capable of following the oscillation of the electric field, is equal to or higher than 600 kHz.

(Third Embodiment)

In a method for manufacturing the sensor S1 according to a third embodiment of the present invention is described as follows. The etching condition in the trench forming process of the method is such that a ratio between the amount of etching of the second semiconductor layer 12 and the amount of deposition of the protection film is controlled in one cycle of the etching step and the deposition step of the protection film.

Figure 6A:
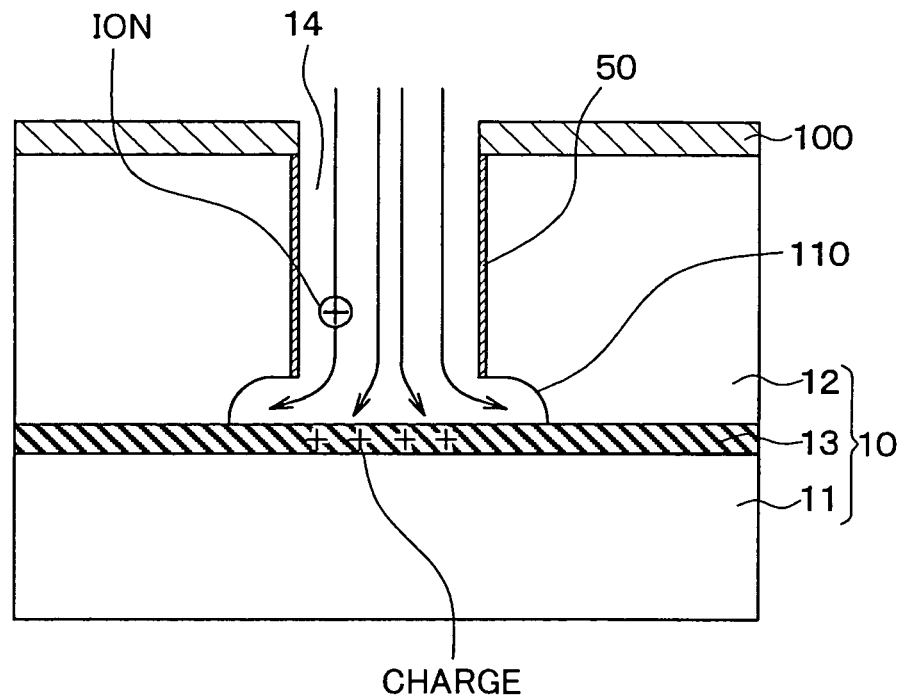
FIGS. 6A and 6B are cross sectional views explaining a method for manufacturing the sensor according to a third embodiment of the present invention.
Figure 6B:
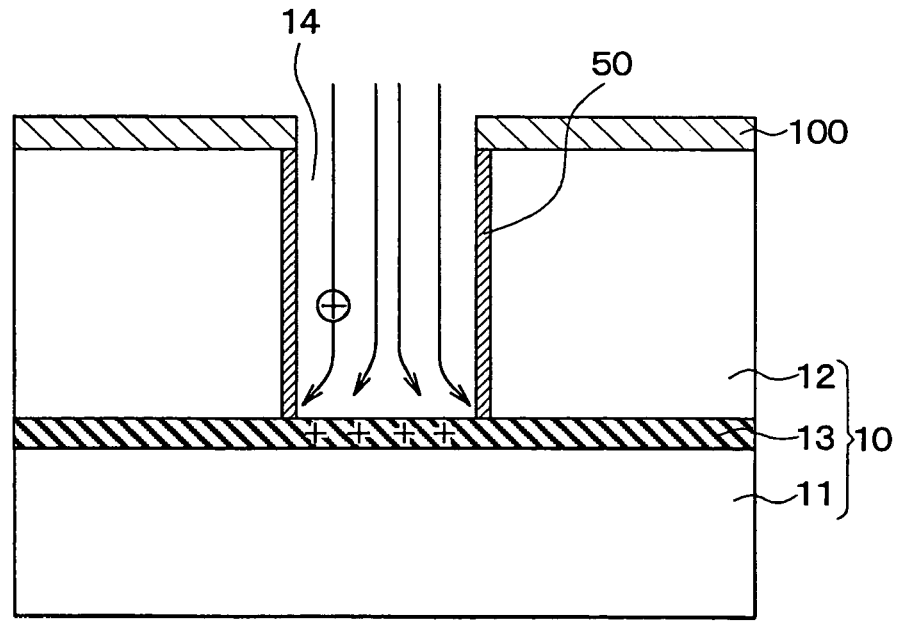

Reactive ion etching equipment for forming a movable portion according to the third embodiment is the equipment shown in FIG. 5 without the first RF power supply 203. This is, the equipment includes only one type of the second RF power supply 204 for applying the high frequency bias electric field. FIG. 6A explains the trench forming process in the method shown in FIGS. 7A to 7C. FIG. 6B explains the trench forming process in the method according to the third embodiment.

In the reactive ion etching process, the etching step for etching the substrate 10 and the protection film depositing step for depositing the protection film 50 on the substrate 10 are alternately performed. In the etching step, the etching gas such as the SF6 gas in the plasma state etches the second semiconductor layer 12. In the protection film depositing step, the protection film 50 is deposited on the inner wall of the trench 14 by using the depositing gas such as the C4F8 gas in the plasma state. The protection film 50 protects the inner wall of the trench 14 from being etched. Thus, the protection film 50 is deposited on the inner wall of the trench 14, and then, the bottom of the trench 14 is etched in the depth direction. These steps are repeated during the reactive ion etching process.

Here, in the method shown in FIG. 6A, the notch 110 is formed on the sidewall of the trench 14. Specifically, in a case where the etching is continued after the bottom of the trench 14 reaches the embedded oxide layer 13, the inner wall of the trench 14 near the bottom of the trench 14 is etched locally in the horizontal direction. Thus, the over-etching provides the notch 110.

In view of the above problem, the method according to the third embodiment is described as follows. In the trench forming process, the amount of deposition of the protection film 50 is comparatively and relatively larger than the amount of etching of the second semiconductor layer 12 in one cycle of the etching step and the deposition step of the protection film 50, compared with the separation process. Here, the protection film 50 is made of, for example, fluoride polymer.

Specifically, the amount of the etching of the second semiconductor layer 12 per one cycle in the etching step is defined as W1, and the amount of the deposition of the protection film 50 per one cycle in the deposition step is defined as W2. The ratio between the amount of the etching and the amount of the deposition is obtained by W2/W1. For example, the amount W1 of the etching per one cycle in both steps is set to be 0.2 μm/cycle. The amount W2 of the deposition per one cycle in the deposition step in the separation process is set to be 10 nm/cycle so that the ratio between W2 and W1 is 0.05. The amount W2 of the deposition per one cycle in the deposition step in the trench forming process is set to be 20 nm/cycle so that the W2/W1 ratio between W2 and W1 is 0.10.

Here, the ratio between the amount of the etching and the amount of the deposition is controlled by a ratio of running time between the etching step and the deposition step. Further, the ratio can be controlled by a RF electric field power for generating plasma, a RF electric field power for applying the bias electric field, a flow rate of the reactive gas, or the pressure of the chamber 200 in each step. Thus, as shown in FIG. 6B, the protection film 50 having comparatively thick thickness is formed on the sidewall of the trench 14. Therefore, the sidewall of the trench 14 is protected from the etching ion flowing toward the sidewall of the trench 14 so that the notch 110 is prevented from forming.

On the other hand, the protection film 50 formed in the deposition step in the separation process is thinner than that in the trench forming process. Further, the amount of the deposition is comparatively small so that the sidewall of the trench 14 is easily etched. Thus, the notch 110 is formed on the sidewall of the trench 14. Accordingly, the movable portion 20 is separated from the embedded oxide layer 13.

Thus, the ratio W2/W1 in the separation process is smaller than the ratio W2/W1 in the trench forming process so that the protection film 50 formed in the separation process is thicker than that in the trench forming process. Thus, the protection film 50 in the separation process is easily etched easier than that in the trench forming process. Accordingly, in the trench forming process, the sidewall of the trench 14 is not etched, and, in the separation process, the sidewall of the trench 14 is etched so that the movable portion 20 is separated from the embedded oxide layer 13.

The ratio W2/W1 in both of the trench forming process and the separation process is controlled as follows. The running time of the etching step in the trench forming process is defined as TA1, the running time of the deposition step in the trench forming process is defined as TA2, and the ratio of the running times between the etching step and the deposition step is defined as TA1/TA2. The running time of the etching step in the separation process is defined as TB1, the running time of the deposition step in the separation process is defined as TB2, and the ratio of the running times between the etching step and the deposition step is defined as TB1/TB2. The etching condition is switched between the trench forming process and the separation process such that the ratio of the running times of TA1/TA2 becomes smaller than the ratio of the running times of TB1/TB2. In this case, the running time of the deposition step in the separation process is shorter than that in the trench forming process.

This is, the process time for depositing the protection film 50 in the separation process is shorter than that in the trench forming process. Accordingly, the protection film 50 formed in the separation process is thinner than that in the trench forming process. Thus, the ratio of W2/W1 in the separation process is smaller than that in the trench forming process.

Further, the ratio W2/W1 can be controlled by the bias electric field power. Specifically, the bias electric field power in the etching step in the trench forming process is set to become smaller than that in the etching step in the separation process. In this case, the ratio of W2/W1 in the separation process is smaller than that in the trench forming process.

Furthermore, the ratio W2/W1 can be controlled by the gas flow rate of the etching gas. Specifically, the gas flow rate of the etching gas in the etching step in the trench forming process is set to become smaller than that in the etching step in the separation process. In this case, the ratio of W2/W1 in the separation process is smaller than that in the trench forming process.

Furthermore, the ratio W2/W1 can be controlled by the gas flow rate of the deposition gas. Specifically, the gas flow rate of the deposition gas in the deposition step in the trench forming process is set to become larger than that in the deposition step in the separation process. In this case, the ratio of W2/W1 in the separation process is smaller than that in the trench forming process.

(Fourth Embodiment)

Figure 16:
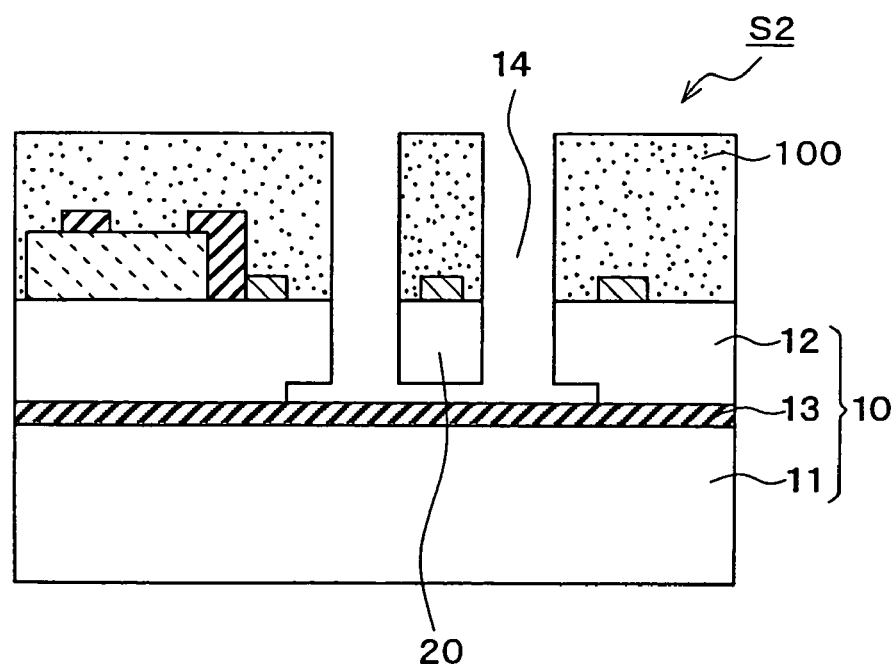
FIG. 16 is a cross sectional view showing a sensor as a comparison, according to the fourth embodiment.

The inventors have preliminarily studied about a needle like protrusion. A semiconductor device S2 formed from the SOI (i.e., silicon on insulator) substrate 10 having the insulation layer 13 disposed inside thereof and the semiconductor layer 12 disposed on the surface of the SOI substrate 10 is shown in FIG. 16.

The SOI substrate 10 is processed in the trench forming process and the separation process so that the device S2 having the movable portion 20 is completed. FIGS. 17A to 17E explain the trench forming process, and FIGS. 18A and 18B explain the separation process.

In the trench forming process, the etching step for etching the semiconductor layer 12 by the plasma of the etching gas and the deposition step for depositing the protection film 50 on the inner wall of the trench 14 by the plasma of the deposition gas are alternately and repeatedly performed.

Firstly, FIG. 17A shows the first cycle of the etching step. The substrate 10 is mounted in the chamber 200. The SF6 gas as an etching gas for etching silicon is introduced into the chamber 200 during a predetermined time such as 7 seconds. Thus, the semiconductor layer 12 is etched partially so that a part of the trench 14 is formed. In this case, the SF6 gas becomes a plasma state in the electric field in the chamber 200 so that the SF6 gas contributes the etching. In FIG. 17A, the SF6 gas is shown as a positive ion. The bias electric field is applied to the substrate 10 so that the positive ion in the plasma is attracted toward the substrate 10. Thus, the trench 14 is etched by an anisotropic etching with the positive ion such as $SF_6^+$ and/or $SF_5^+$ ion.

Next, as shown in FIG. 17B, the deposition step is performed. Specifically, the SF6 gas as the etching gas is stopped to introduce into the chamber 200. Instead, the C4F8 gas as the deposition gas is introduced into the chamber 200 during a predetermined time such as 8 seconds. In this deposition step, no bias electric field is applied to the substrate 10. Thus, the protection film 50 is uniformly formed on the sidewall and the inner wall of the trench 14. When the fluoride gas such as the C4F8 gas is used as the deposition gas, the protection film 50 is made of fluoride polymer.

Then, as shown in FIGS. 17C and 17D, the etching step and the deposition step are alternately and repeatedly performed. Here, the etching depth of the etching step per one cycle is, for example, 0.1 µm to 0.5 µm. Thus, the trench 14 reaches the surface of the insulation layer 13.

Next, the separation process is performed as shown in FIGS. 18A and 18B. In the separation process, the etching step for etching the semiconductor layer 12 by the plasma of the etching gas and the deposition step for depositing the protection film 50 on the inner wall of the trench 14 by the plasma of the deposition gas are alternately and repeatedly performed. As shown in FIG. 18A, the surface of the insulation layer 13 is charged positively by the positive ion in the etching gas. In the etching step of the separation process, the positive ion of the etching gas is introduced toward the trench 14. In this case, as shown in FIG. 18B, the positive ion is repelled by the insulation layer charged positively near the bottom of the trench 14. Thus, the positive ion is diffused in the horizontal direction so that the sidewall of the trench, i.e., the semiconductor layer 12 disposed near the bottom of the trench 14 is etched in the horizontal direction. Accordingly, the notch 110 is formed on the sidewall of the trench 14.

Here, the positive ion of the etching gas etches the semiconductor layer 12 and the protection film 50 by chemical etching or physical sputtering. Thus, the notch 110 becomes larger so that the semiconductor layer 12 is separated from the insulation layer 13. Finally, the movable portion 20 is formed.

Figure 19A:
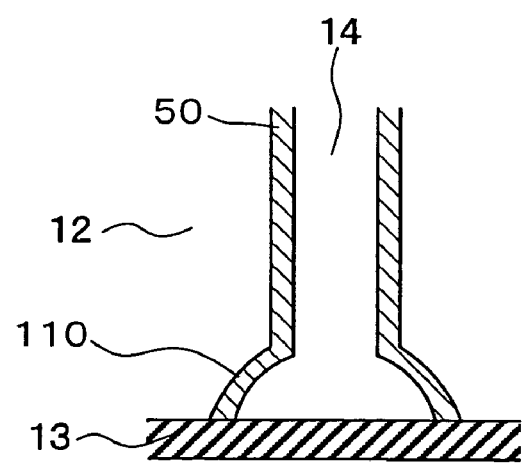
FIGS. 19A to 19C are cross sectional views explaining a formation of a needle like protrusion, according to the fourth embodiment.
Figure 19B:
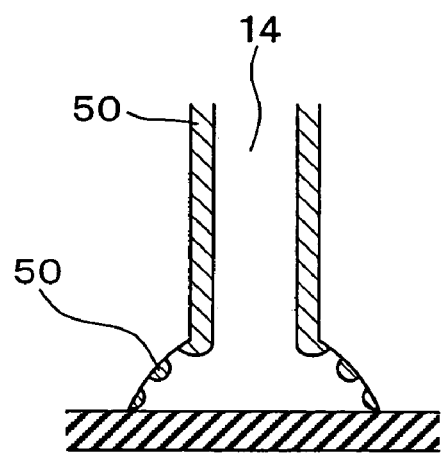
Figure 19C:
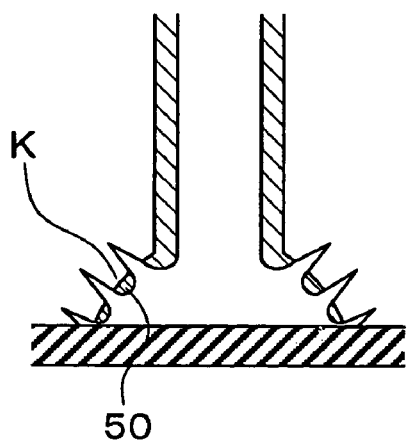

Here, in the separation process, a needle like protrusion may be formed as follows. FIGS. 19A to 19C explain the etching in the separation process. The etching gas etches the semiconductor layer 12 with removing the protection film 50 so that the notch 110 is formed. When the protection film 50 is strong, i.e., thick, a part of the protection film 50 remains, as shown in FIG. 19B. Thus, the semiconductor layer 12 with the part of the protection film 50 is etched. In this case, the protection film 50 remained on the sidewall of the trench 14 works as a mask so that a needle like protrusion K is formed on the inner wall of the trench 14, as shown in FIG. 19C. Specifically, the protrusion K is disposed on the inner wall of the notch 110, which faces the insulation layer 13. The protrusion K of the notch 110 may be broken when a large impact is applied to the protrusion K so that the protrusion K crashes the insulation layer 13. The broken protrusion K may cause a particle, and the particle may cause a problem.

Figure 8:
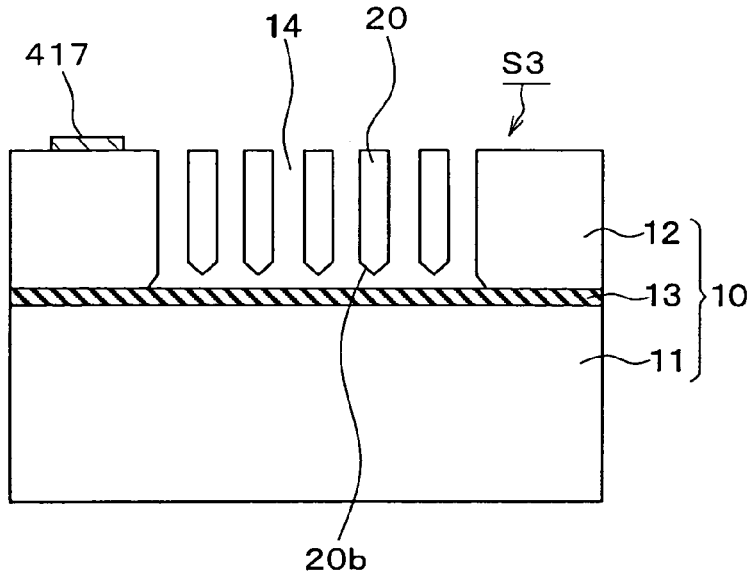
FIG. 8 is a cross sectional view showing a semiconductor acceleration sensor according to a fourth embodiment.

In view of the above problem, a method for manufacturing a sensor S3 according to a fourth embodiment of the present invention is described as follows. FIG. 8 is a schematic cross sectional view showing the sensor S3. The sensor S3 is formed from the SOI substrate 10 having the first and second silicon layer 11, 12 and the silicon oxide layer 13 disposed between the first and second silicon layer 11, 12. The movable portion 20 is provided by a part of the second silicon layer 12, which is separated from the silicon oxide layer 13. This is, the movable portion 20 is surrounded by the trench 14 so that the movable portion 20 is separated from the other silicon layer 12 disposed around the movable portion 20. Further, a space is disposed under the movable portion 20 so that a hollow portion is formed.

Figure 9:
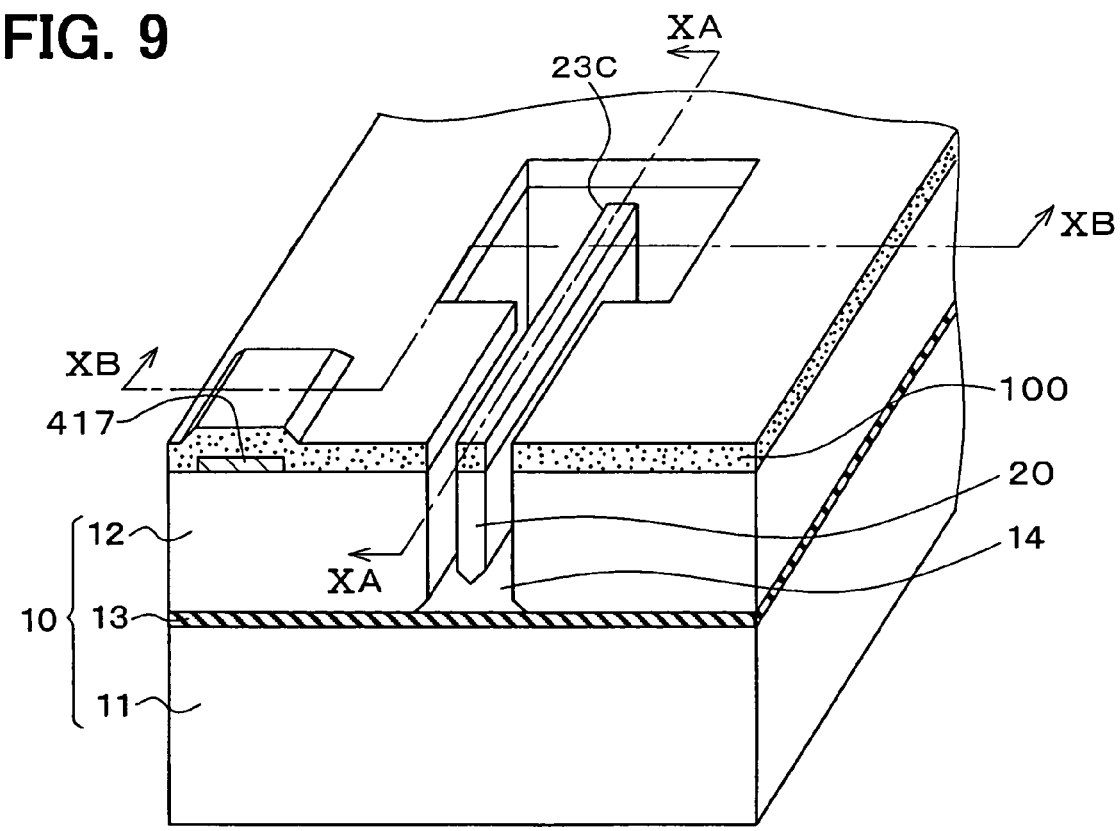
FIG. 9 is a schematic perspective view showing the sensor according to the fourth embodiment.
Figure 10A:
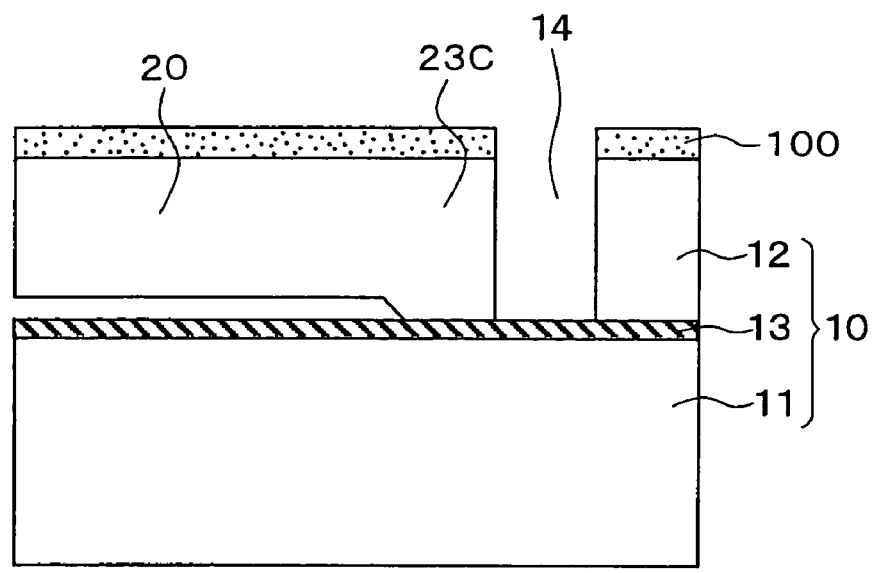
FIG. 10A is a cross sectional view showing the sensor taken along line XA—XA in FIG. 9.
Figure 10B:
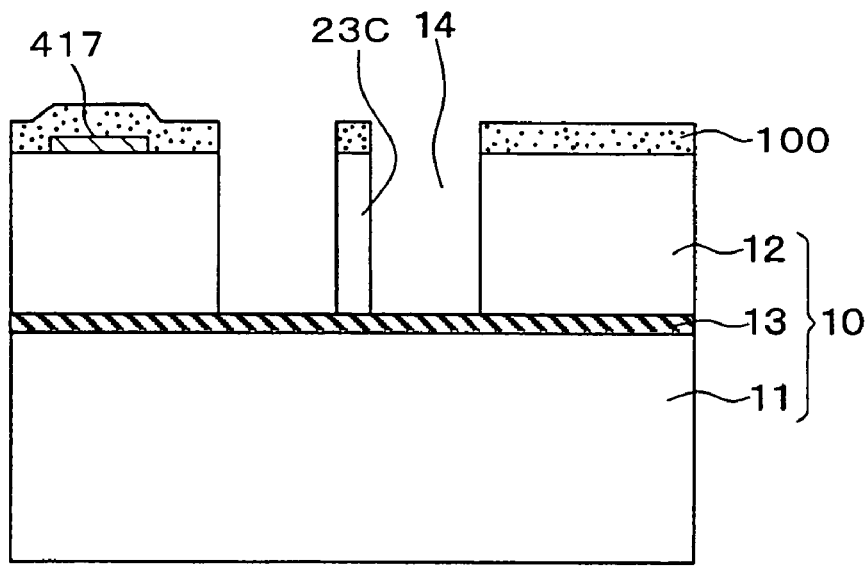
FIG. 10B is a cross sectional view showing the sensor taken along line XB—XB in FIG. 9.

FIGS. 9, 10A and 10B show a support construction for supporting the movable portion 20. The movable portion 20 connects to an anchor 23c. The anchor 23c is supported on the first silicon layer 11 through the silicon oxide layer 13. Thus, the movable portion 20 is cantilevered by the anchor 23c so that the movable portion 20 is movable. The acceleration applied to the sensor S3 is detected by using the movable portion 20. This detection mechanism can be the same as a conventional capacitance type acceleration sensor. Specifically, when the acceleration is applied to the sensor S3, the movable portion 20 is displaced or deformed in a predetermined direction so that a distance between the movable portion 20 and a fixed portion is changed. The movable potion 20 is separated from the fixed portion through the trench 14. The change of the distance causes a capacitance change of a capacitor between the movable portion 20 and the fixed portion so that the acceleration is detected.

An electrode pad 417 is formed on the second silicon layer 12 at a predetermined position. The electrode pad 417 is made of aluminum or the like. The electrode pad 417 connects to an external circuit. The electrode pad includes the movable electrode pad 20a and the fixed electrode pad 31a, 41a.

Figure 11A:
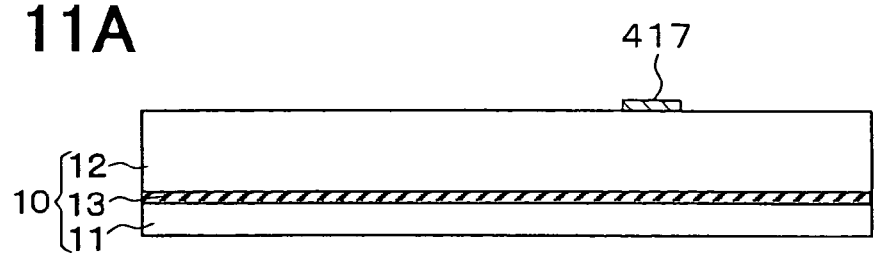
FIGS. 11A to 11E are cross sectional views explaining a method for manufacturing the sensor according to the fourth embodiment.
Figure 11B:
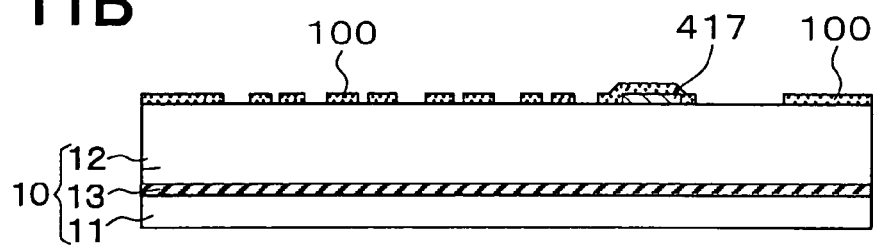
Figure 11C:
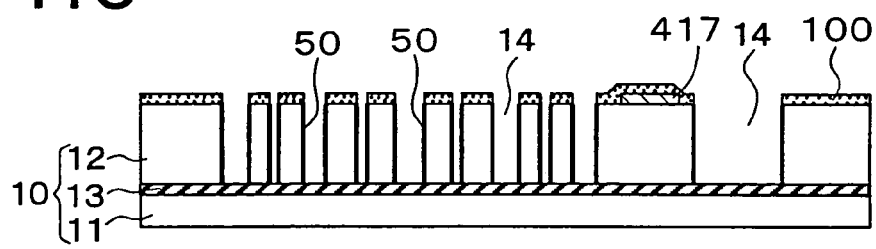
Figure 11D:
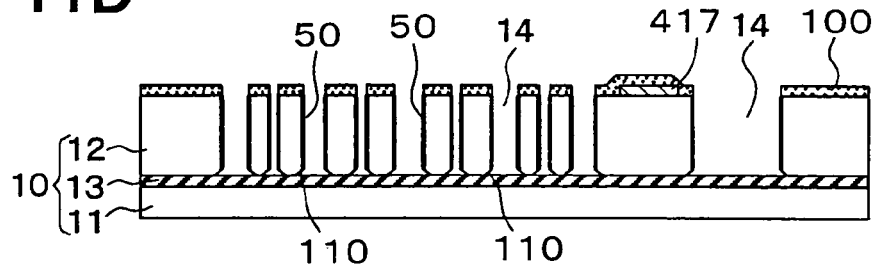
Figure 11E:
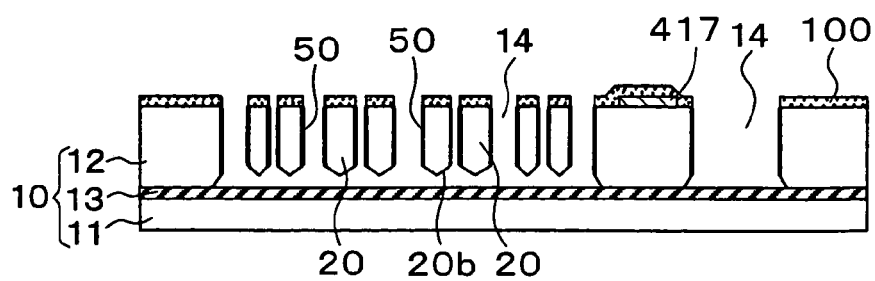

The sensor S3 is manufactured as follows. As shown in FIGS. 11A to 11E, the pad 417 is formed on the surface of the second silicon layer 12 by using a film deposition method such as a sputtering method and an evaporation method and by using a photo lithography method. Next, the mask 100 having a predetermined pattern is formed on the second silicon layer 12. This is a mask forming process. The mask 100 includes an opening corresponding to the trench 14. Then, the trench 14 is formed on the second silicon layer 12. This is the trench forming process. This process is provided by the reactive ion etching method having the etching step and the deposition step shown in FIGS. 10A to 10E. Specifically, the etching step for etching the second silicon layer 12 and the deposition step for depositing the protection film 50 are alternately and repeatedly performed. These steps are repeated by three cycles and more. Thus, the trench 14 is formed to reach the silicon oxide layer 13 and to have the protection film 50 disposed on the inner wall of the trench 14. Then, the separation process is performed so that the movable portion 20 is formed, as shown in FIGS. 11D and 11E. Then, the mask 100 is removed by a dry etching method such as an oxygen ashing method and the like. Thus, the sensor S3 is completed.

In the above method, the protection film 50 formed in the trench forming process has a strong protection effect, which is stronger than that in the separation process. To perform this constitution, the etching conditions in the trench forming process and the separation process are controlled.

The protection effect of the protection film 50 is controlled by a time. Specifically, a ratio of running time between the etching step and the deposition step is controlled to control the protection effect. The running time of the etching step in the trench forming process is defined as TA1, the running time of the deposition step in the trench forming process is defined as TA2, and the ratio of the running times between the etching step and the deposition step is defined as TA1/TA2. The running time of the etching step in the separation process is defined as TB1, the running time of the deposition step in the separation process is defined as TB2, and the ratio of the running times between the etching step and the deposition step is defined as TB1/TB2. The etching conditions in the trench forming process and the separation process are controlled such that the time ration of TA1/TA2 becomes smaller than the time ratio of TB1/TB2. For example, the running time of TA1 in the trench forming process is set to be 7 seconds, and the running time of TA2 in the trench forming process is set to be 5 seconds so that the time ration of TA1/TA2 becomes 1.4. On the other hand, the running time of TB1 in the separation process is set to be 7 seconds, and the running time of TB2 in the separation process is set to be 4 seconds so that the time ration of TB1/TB2 becomes 1.75, which is larger than the time ratio of TA1/TA2.

In this case, the running time of the deposition step in the separation process is shorter than that in the trench forming process. This is, the deposition time for depositing the protection film 50 in the separation process is shorter than that in the trench forming process. Therefore, the protecting film 50 formed in the separation process is thinner than that in the trench forming process. Thus, by controlling the time ratios of TA1/TA2 and TB1/TB2, the protection effect of the protection film 50 formed in the trench forming process is comparatively stronger than that in the separation process.

The protection effect of the protection film 50 can be controlled by the bias electric field (i.e., the power of the bias electric field for applying to the substrate 10). Specifically, the bias electric field in the etching step is optimized to control the protection effect. The bias electric field in the etching step in the separation process is larger than that in the trench forming process. For example, the power of the bias electric field for applying to the substrate 10 in the etching step in the trench forming process is set to be 23 W, and the power of the bias electric field for applying to the substrate 10 in the etching step in the separation process is set to be 50 W to 70 W. Thus, the bias electric field in the separation process is set to be larger so that a sputtering effect of the etching in the separation process is larger than that in the trench forming process. This is because the plasma of the etching gas is strongly attracted toward the substrate 10 so that the positive ion in the plasma etches the second silicon layer 12 anisotropically when the bias electric field is applied to the substrate 10 in the etching step for etching the second silicon layer 12. By controlling the bias electric field in the separation process to be larger than that in the trench forming process, the process time of the separation process can become shorter. Further, the needle like protrusion K on the inner wall of the notch 110 is reduced. Here, if the bias electric field in the separation process becomes excessively larger, the protection film 50 disposed on the inner wall of the trench 14 but also the part of the trench 14 disposed near the bottom of the trench 14 is etched. For example, the protection film 50 disposed near the surface of the second silicon layer 12 may be etched. Therefore, it is preferred that the power of the bias electric field in the separation process is equal to or smaller than 70 W. Thus, by controlling the bias electric field, the protection effect of the protection film 50 formed in the separation process is comparatively weaker than that in the trench forming process.

Further, the protection effect of the protection film 50 can be controlled by the gas flow rate of the etching gas in the etching step. Specifically, the gas flow rate of the etching gas in the etching step is optimized to control the protection effect. The gas flow rate of the etching gas in the etching step in the separation process is larger than that in the trench forming process. In this case, the etching rate of the protection film 50 and the second silicon layer 12 in the separation process is larger than that in the trench forming process. Thus, by controlling the gas flow rate of the etching gas, the protection effect of the protection film 50 formed in the separation process is comparatively weaker than that in the trench forming process.

Further, the protection effect of the protection film 50 can be controlled by the gas flow rate of the deposition gas in the deposition step. Specifically, the gas flow rate of the deposition gas in the deposition step is optimized to control the protection effect. The gas flow rate of the deposition gas in the deposition step in the separation process is smaller than that in the trench forming process. In this case, the deposition rate of the protection film 50 in the separation process is smaller than that in the trench forming process so that the protection film 50 formed in the separation process is thinner than that in the trench forming process. Thus, by controlling the gas flow rate of the deposition gas, the protection effect of the protection film 50 formed in the separation process is comparatively weaker than that in the trench forming process.

Further, the protection effect of the protection film 50 can be controlled by the pressure of the chamber 200. Specifically, the pressure of the reactive gas in the chamber 200 in the separation process is set to be lower than that in the trench forming process. In this case, the plasma energy in the separation process becomes larger as the reactive gas pressure, i.e., the chamber pressure in the chamber 200 becomes lower. Thus, the sputtering effect in the etching step in the separation process becomes larger so that the protection effect of the protection film 50 formed in the separation process is comparatively weaker than that in the trench forming process.

Further, the protection effect of the protection film 50 can be controlled by the temperature of the substrate 10. Specifically, the temperature of the substrate 10 in the separation process is set to be higher than that in the trench forming process. In this case, the protection film 50 is deposited slowly in the separation process as the temperature of the substrate 10 becomes higher. Thus, the thickness of the protection film 50 in the separation process becomes thinner so that the protection effect of the protection film 50 formed in the separation process is comparatively weaker than that in the trench forming process.

Thus, the method for decreasing the protection effect of the protection film 50 in the separation process described above is, controlling the time ratio of the running times between the trench forming process and the deposition process, controlling the bias electric field, controlling the gas flow rate of the etching gas, controlling the gas flow rate of the deposition gas, controlling the chamber pressure or controlling the substrate temperature. These methods can be combined to decrease the protection effect, and further, all methods can be performed at the same time.

Thus, the etching condition of the trench forming process is switched to the etching condition of the separation process. In the trench forming process, the protection effect of the protection film 50 is comparatively strong so that the trench 14 is easily and precisely formed in a vertical direction of the substrate 10, which is a depth direction of the trench 14. In the separation process, the protection effect of the protection film 50 is comparatively weak so that the etching rate of the sidewall of the trench 14 in the horizontal direction in the separation process is larger than that in the trench forming process. Therefore, the process time of the separation process becomes shorter. Further, the protection film 50 formed in the separation process is easily removed by the etching in the horizontal direction in the separation process. Thus, the protection film 50 on the inner wall of the trench 40 is not partially remained so that no needle like protrusion on the inner wall of the notch 110 is formed.

Here, if the etching condition of the trench forming process is the same as the etching condition of the separation process so that the protection effect of the protection film 50 is weak, the etching in the horizontal direction is promoted so that the width of the trench 14 becomes wider. Thus, the predetermined width of the trench 14 is not obtained.

In this embodiment, the needle like protrusion K is prevented from forming. Further, the sensor S3 formed by the above method has a convexity 20b on the bottom of the movable portion 20. Specifically, as shown in FIGS. 8 and 11E, the bottom 20b of the movable portion, i.e., the bottom of the second silicon layer 12, which faces the silicon oxide layer 13, has the convexity 20b. This convexity 20b on the bottom 20b of the movable portion 20 is confirmed by the present experiment, which is studied by the inventors.

Even if the bottom of 20b of the movable portion 20 contacts the silicon oxide layer 13, the contact area of the bottom of the movable portion is much small so that the movable portion 20 is protected from adhering to the silicon oxide layer 13. Specifically, the convexity 20b of the movable portion prevents the movable portion from adhering to the silicon oxide layer 13. Thus, a sticking effect of the movable portion 20 is prevented. The sticking effect is one of problems in a prior art, because the movable portion sticks, i.e., adheres to the silicon oxide layer 13 so that the sensor S3 may not work precisely.

Although the introduction of the etching gas into the chamber 200 and the introduction of the deposition gas into the chamber 200 are switched timely so that the etching gas or the deposition gas is introduced into the chamber 200 separately in terms of time, the etching gas and the deposition gas can be introduced into the chamber 200 at the same time. For example, mixture of the etching gas and the deposition gas can be introduced into the chamber 200.

Further, although the etching gas is formed from a single gas, and the deposition gas is formed from another single gas, they can be formed from multiple gasses.

Furthermore, although the substrate 10 is the SOI substrate, the substrate 10 can be another type of substrate having the insulation layer disposed inside thereof, and the semiconductor layer disposed on the surface of the substrate 10.

(Fifth Embodiment)

Figure 12:
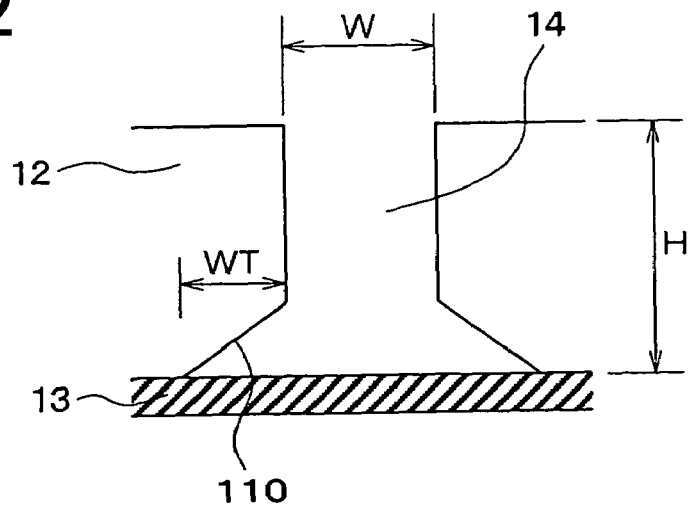
FIG. 12 is a schematic cross sectional view showing a trench of a sensor according to a fifth embodiment of the present invention.
Figure 13A:
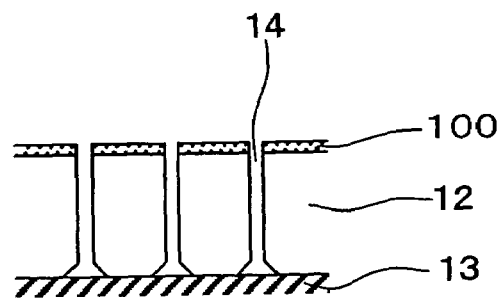
FIGS. 13A to 13D are cross sectional views showing the trenches having different aspect ratios, according to the fifth embodiment.
Figure 13B:
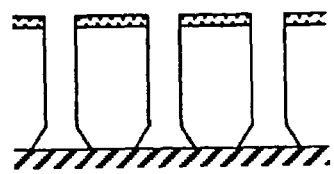
Figure 13C:
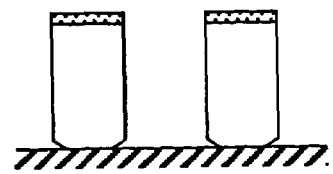
Figure 13D:
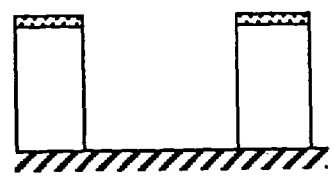
Figure 14:
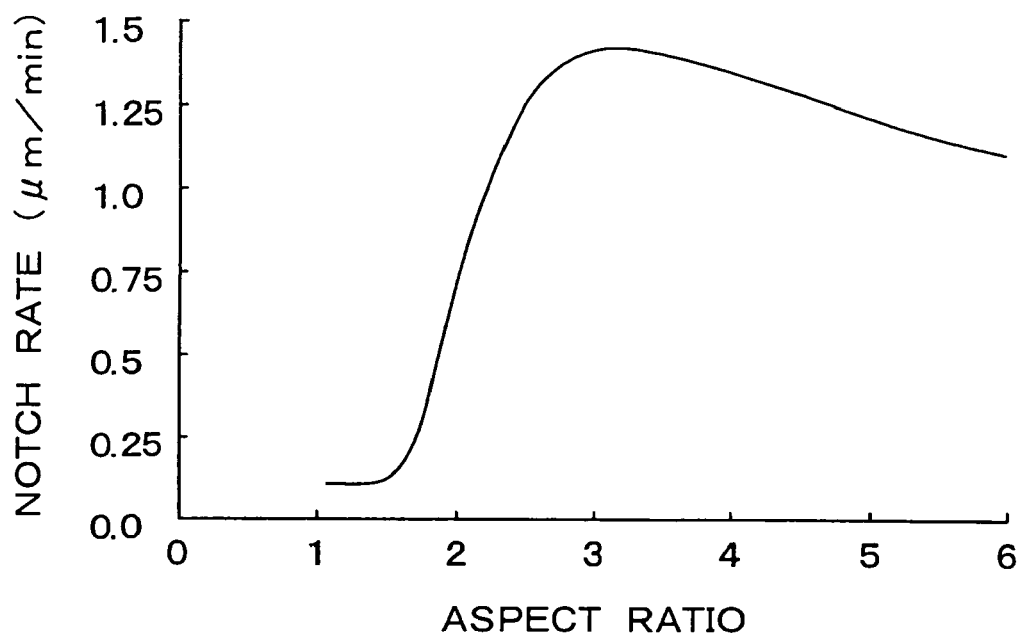
FIG. 14 is a graph showing a relationship between an aspect ratio and a notch rate, according to the fifth embodiment.

The inventors have studied it is preferred that an aspect ration of the trench 14 is set to be in a predetermined range. The advantage of this is described as follows. FIG. 12 shows the trench 14 having the notch 110. The depth of the trench 14 is defined as H, and the width of the trench 14 is defined as W, so that the aspect ration of the trench 14 is H/W. FIGS. 13A to 13D show the notch 110 of the trench 14 having different aspect ratio. The aspect ratio of the trench 14 shown in FIG. 13A is 11, the aspect ratio in FIG 13B is 4.4, the aspect ratio in FIG. 13C is 1.7, and the aspect ratio in FIG. 13D is 0.9. FIGS. 13A to 13D are obtained by an observation of microscope. As the aspect ratio of the trench 14 becomes smaller, the notch 110 becomes smaller, i.e., the notch is not easily formed. FIG. 14 shows a relationship between the aspect ratio and a notch-forming rate (i.e., notch rate). Here, the notch rate is a width WT of the notch 110 in the horizontal direction per unit time. Thus, the notch rate is a forming speed of the notch 110 per unit time, and has unit of μm/min. When the notch rate is equal to null, no notch 110 is formed on the sidewall of the trench 14. In this case, the second silicon layer 12 is not separated from the silicon oxide layer 13 so that the movable portion 20 is not formed.

As shown in FIG. 14, as the aspect ratio of the trench 14 becomes smaller, the notch rate of the notch 110 becomes smaller. When the aspect ratio is equal to or larger than 2.5, the notch rate is large enough to form the movable portion 20. In this case, the notch 110 is properly formed so that the movable portion 20 is formed. Further, the etching time, i.e., the process time of the separation process becomes shorter. If both of the neighboring trenches 14 disposed on both sides of a movable-portion-to-be-formed portion of the second silicon layer 12 have the aspect ratio smaller than 2.5, the notches 110 of both of the trenches 14 are not sufficiently formed so that the movable portion 20 is not separated from the silicon oxide layer 13. Thus, the movable portion 20 is not formed. When at least one of the neighboring trenches 14 disposed on both sides of a movable-portion-to-be-formed portion of the second silicon layer 12 has the aspect ratio equal to or larger than 2.5, one of the notches 110 of both of the trenches 14 is sufficiently formed so that the movable portion 20 is separated from the silicon oxide layer 13. Thus, the movable portion 20 is properly formed. Thus, it is preferred that at least one of the neighboring trenches 14 disposed on both sides of a movable-portion-to-be-formed portion of the second silicon layer 12 has the aspect ratio equal to or larger than 2.5.

As shown in FIG. 10B, the movable portion 20 is supported on the silicon oxide layer 13 through the anchor 23c, which connects to the movable portion and is surrounded with the trench 14. It is preferred that at least two trenches 14 disposed on two adjoining sides of the anchor 23c have the aspect ratio equal to or smaller than 2. In this case, no notch 110 is formed on the sidewall of the trench 14. This is because the notch 110 is not easily formed when the trench 14 has the aspect ratio smaller than 2.5, as shown in FIG. 14. Further, when the aspect ratio of the trench 14 is equal to or smaller than 2, no notch is formed on the sidewall of the trench 14 substantially. Thus, the anchor 23c having no notch 110 is properly formed, and the anchor 23c is not separated from the silicon oxide layer 13. In FIGS. 9 to 10B, three trenches 14 disposed on three sides of the anchor 23c except for the side connecting to the movable portion 20 have the aspect ratio equal to or smaller than 2.

(Sixth Embodiment)

Figure 15A:
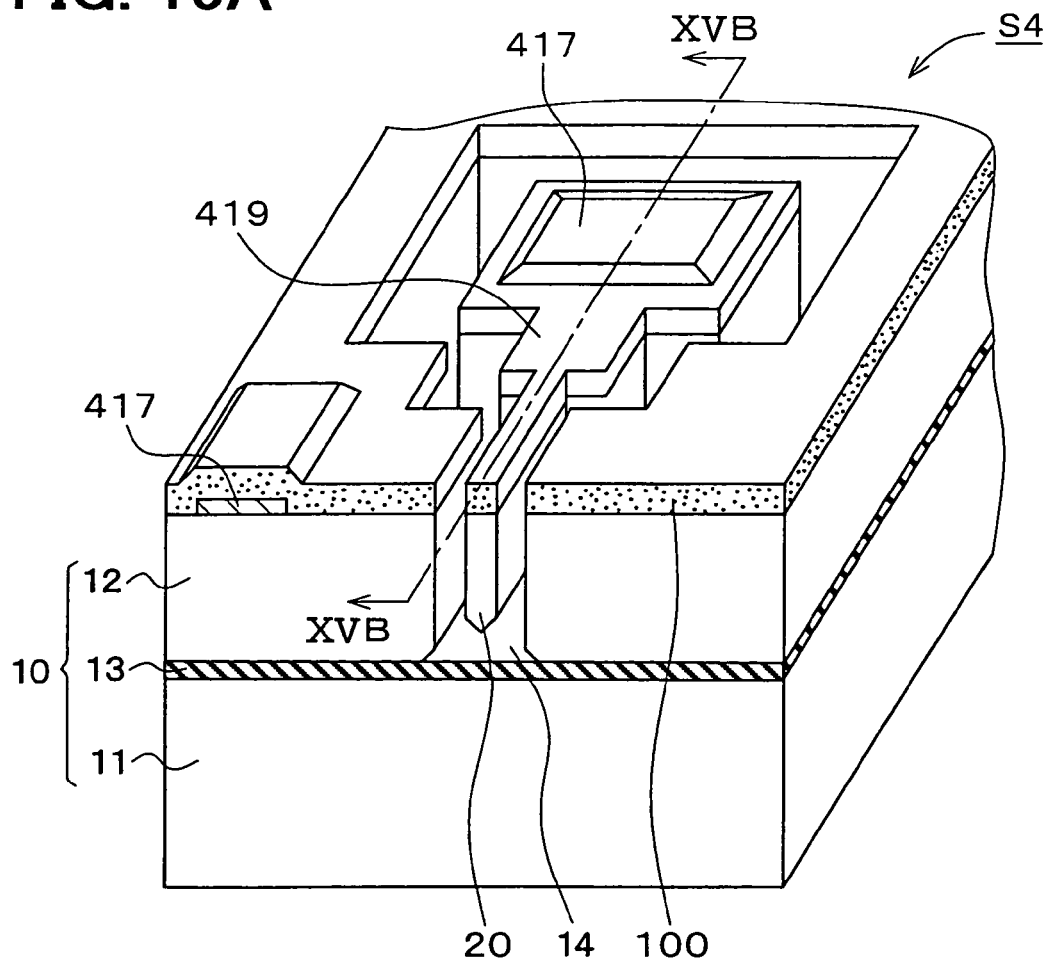
FIG. 15A is a perspective view showing a sensor according to a sixth embodiment of the present invention.
Figure 15B:
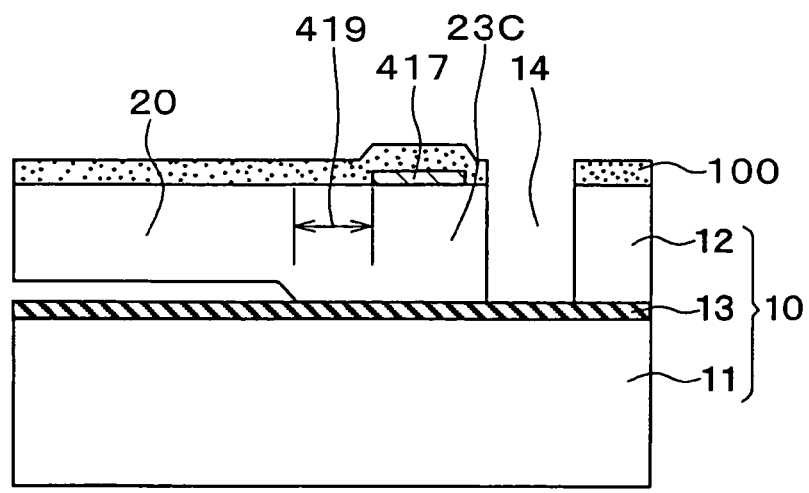
FIG. 15B is a cross sectional view showing the sensor taken along line XVB—XVB in FIG. 15A.

A method for manufacturing a sensor S4 according to a sixth embodiment of the present invention is described as follows. The sensor S4 is shown in FIGS. 15A and 15B. The sensor S4 includes a wiring portion 419. The movable portion 20 is supported on the silicon oxide layer 13 through the wiring portion 419 and the anchor 23c. The movable portion 20 electrically connects to the electrode pad 417 through the wiring portion 419.

In this case, the anchor 23c and the wiring portion 419 are strongly fixed on the embedded oxide layer 13 so that the movable portion 20 is stably supported on the embedded oxide layer 13 through the anchor 23c and the wiring portion 419.

Such changes and modifications are to be understood as being within the scope of the present invention as defined by the appended claims.

What is claimed is:

1. A method for manufacturing a semiconductor device having a movable portion, the method comprising the steps of:

forming a trench on a semiconductor layer so that the trench reaches an insulation layer disposed under the semiconductor layer; and forming the movable portion by etching a sidewall of the trench disposed near the bottom of the trench in a direction parallel to the insulation layer so that the semiconductor layer is separated from the insulation layer, wherein the steps of forming the trench and forming the movable portion are performed by a reactive ion etching method, wherein the insulation layer disposed on the bottom of the trench is prevented from charging positively in the step of forming the trench, and wherein the insulation layer disposed on the bottom of the trench is charged positively in the step of forming the movable portion.

2. The method according to claim 1, wherein the step of forming the trench is provided by a first etching condition, and the step of forming the movable portion is provided by a second etching condition, wherein the first etching condition includes a bias electric field having a pulse-like oscillation with a first frequency in a range, in which a positive ion in the plasma is capable of following the bias electric field, and wherein the second etching condition includes another bias electric field having a continuous oscillation with a second frequency in a range, in which a positive ion in the plasma is not capable of following the bias electric field.

3. The method according to claim 2, wherein the first frequency is equal to or lower than 600 kHz, and the second frequency is higher than 600 kHz.

4. The method according to claim 1, wherein the reactive ion etching method is performed in such a manner that an etching step and a deposition step are alternately and repeatedly performed, wherein the etching step is such that an etching gas in the plasma state etches the semiconductor layer, and wherein the deposition step is such that a deposition gas in the plasma state deposits a protection film on the inner wall of the trench.

5. The method according to claim 4, wherein an amount of etching of the semiconductor layer in the etching step is defined as W1, wherein an amount of deposition of the protection film in the deposition step is defined as W2, wherein a ratio of the amounts between the etching and the deposition is defined as W2/W1, and wherein the ration of W2/W1 in the step of forming the movable portion is smaller than the ration of W2/W1 in the step of forming the trench.

6. The method according to claim 4, wherein the protection film formed in the deposition step in the step of forming the movable portion has a protection effect, which is comparatively weaker than that in the step of forming the trench.

7. The method according to claim 6, wherein the etching step in the step of forming the trench has a running time defined as TA1, and the deposition step in the step of forming the trench has another running time defined as TA2 so that a first time ratio between TA1 and TA2 is defined as TA1/TA2, wherein the etching step in the step of forming the movable portion has a running time defined as TB1, and the deposition step in the step of forming the movable portion has another running time defined as TB2 so that a second time ratio between TB1 and TB2 is defined as TB1/TB2, and wherein the first time ratio of TA1/TA2 is set to be smaller than the second time ratio of TB1/TB2 so that the protection effect of the protection film in the step of forming the movable portion is comparatively weaker than that in the step of forming the trench.

8. The method according to claim 6,
wherein the etching step in the step of forming the trench has a first electric power of a bias electric field applied to the substrate,
wherein the etching step in the step of forming the movable portion has a second power of the bias electric field, and
wherein the first power of the bias electric field is set to be smaller than the second power of the bias electric field so that the protection effect of the protection film in the step of forming the movable portion is comparatively weaker than that in the step of forming the trench.

9. The method according to claim 6,
wherein the etching step in the step of forming the trench has a first gas flow rate of the etching gas,
wherein the etching step in the step of forming the movable portion has a second gas flow rate of the etching gas, and
wherein the first gas flow rate is set to be smaller than the second gas flow rate so that the protection effect of the protection film in the step of forming the movable portion is comparatively weaker than that in the step of forming the trench.

10. The method according to claim 6,
wherein the etching step in the step of forming the trench has a first gas flow rate of the deposition gas,
wherein the etching step in the step of forming the movable portion has a second gas flow rate of the deposition gas, and
wherein the first gas flow rate is set to be larger than the second gas flow rate so that the protection effect of the protection film in the step of forming the movable portion is comparatively weaker than that in the step of forming the trench.

11. The method according to claim 6,
wherein the etching step in the step of forming the trench has a first chamber pressure,
wherein the etching step in the step of forming the movable portion has a second chamber pressure, and
wherein the second chamber pressure is set to be lower than the first chamber pressure so that the protection effect of the protection film in the step of forming the movable portion is comparatively weaker than that in the step of forming the trench.

12. The method according to claim 6,
wherein the etching step in the step of forming the trench has a first substrate temperature,
wherein the etching step in the step of forming the movable portion has a second substrate temperature, and
wherein the first substrate temperature is set to be lower than the second substrate temperature so that the protection effect of the protection film in the step of forming the movable portion is comparatively weaker than that in the step of forming the trench.

13. The method according to claim 6,
wherein the movable portion has a convexity disposed on a bottom of the movable portion, which faces the insulation layer.

14. The method according to claim 6,
wherein the trench has a depth defined as H and a width defined as W so that an aspect ratio of the trench is H/W, and
wherein at least one of the neighboring trenches disposed on both sides of a movable-portion-to-be-formed portion of the second semiconductor layer has the aspect ratio equal to or larger than 2.5.

15. The method according to claim 6,
wherein the trench has a depth defined as H and a width defined as W so that an aspect ratio of the trench is H/W,
wherein the movable portion is supported on the insulation layer through an anchor, which connects to the movable portion and is surrounded by the trench, and
wherein at least two trenches disposed on two adjoining sides of the anchor have the aspect ratio equal to or smaller than 2.

16. A method for manufacturing a semiconductor device, the method comprising the steps of:
preparing a semiconductor substrate including an insulation layer and a semiconductor layer, wherein the insulation layer is disposed inside of the substrate, and the semiconductor layer is disposed on a surface of the substrate;
forming a mask having a predetermined pattern on the semiconductor layer;
forming a trench on the semiconductor layer by etching the semiconductor layer through the mask, wherein the trench is disposed from the surface of the semiconductor layer and reaches the insulation layer; and
forming a movable portion by etching a sidewall of the trench disposed near the bottom of the trench in a direction parallel to the insulation layer so that the semiconductor layer is separated from the insulation layer,
wherein the step of forming the trench has a first etching condition, and the step of forming the movable portion has a second etching condition,
wherein the first etching condition in the step of forming the trench provides in such a manner that a sidewall of the trench disposed near the bottom is not etched in a case where the etching is continued after the bottom of the trench reaches the insulation layer, and
wherein the second etching condition in the step of forming the movable portion provides in such a manner that the sidewall of the trench disposed near the bottom is etched in a case where the etching is continued after the bottom of the trench reaches the insulation layer.

17. The method according to claim 16,
wherein the step of forming the trench is switched to the step of forming the movable portion after the whole insulation layer, which is defined by an opening of the mask, is exposed.

18. The method according to claim 17,
wherein the insulation layer is exposed from the opening of the mask at a predetermined time, and
wherein the predetermined time is determined on the basis of a calculated time calculated from a thickness of the semiconductor layer and an etching rate of the semiconductor layer disposed at the opening of the mask.

19. The method according to claim 17,
wherein the insulation layer is exposed from the opening of the mask at a predetermined time,
wherein the predetermined time is determined on the basis of an observation of interference fringes of the bottom of the trench, which is monitored by a monitor during the trench is being etched in the trench forming process, and
wherein the predetermined time is defined when the interference fringes are disappeared.

20. The method according to claim 17,
wherein the steps of forming the trench and forming the movable portion are performed by a reactive ion etching method,
wherein the insulation layer is exposed from the opening of the mask at a predetermined time, and
wherein the predetermined time is determined on the basis of a strength change of a predetermined peak in an emission spectrum or a strength change of all emission, which is detected by a detector for detecting the emission spectrum emitted from a reactive ion.

21. The method according to claim 16,
wherein the substrate is formed from a chip such that a semiconductor wafer is cut into a plurality of chips,
wherein the steps of forming the trench and forming the movable portion are performed with the wafer, and
wherein the step of forming the trench is switched to the step of forming the movable portion after the whole insulation layer, which is defined by an opening of the mask, is exposed.

22. The method according to claim 21,
wherein the insulation layer is exposed from the opening of the mask at a predetermined time, and
wherein the predetermined time is determined on the basis of a calculated time calculated from a thickness of the semiconductor layer and an etching rate of the semiconductor layer disposed at the opening of the mask.

23. The method according to claim 21,
wherein the insulation layer is exposed from the opening of the mask at a predetermined time,
wherein the predetermined time is determined on the basis of an observation of interference fringes of the bottom of the trench, which is monitored by a monitor during the trench is being etched in the trench forming process, and
wherein the predetermined time is defined when the interference fringes are disappeared.

24. The method according to claim 21,
wherein the steps of forming the trench and forming the movable portion are performed by a reactive ion etching method,
wherein the insulation layer is exposed from the opening of the mask at a predetermined time, and
wherein the predetermined time is determined on the basis of a strength change of a predetermined peak in an emission spectrum or a strength change of all emission, which is detected by a detector for detecting the emission spectrum emitted from a reactive ion.

25. The method according to claim 16,
wherein the step of forming the movable portion is ended when the movable portion is separated from the insulation layer so that a gap between the movable portion and the insulation layer becomes a predetermined gap.

26. The method according to claim 16,
wherein the semiconductor layer is made of silicon.

27. The method according to claim 16,
wherein the insulation layer is made of silicon oxide.

28. The method according to claim 16,
wherein the steps of forming the trench and forming the movable portion are performed by a reactive ion etching method such that the substrate is mounted in a vacuum chamber and a reactive gas is introduced into the chamber to become a plasma state.

29. The method according to claim 28,
wherein the first etching condition in the step of forming the trench is such that the insulation layer disposed on the bottom of the trench is prevented from charging.

30. The method according to claim 29,
wherein the reactive ion etching method is performed by etching equipment including an activating radio frequency electric power supply for activating the reactive gas to generate plasma and a bias radio frequency electric power supply for applying a bias electric field,
wherein the bias radio frequency electric power supply applies the bias electric field to the substrate so that a reactive ion in the plasma is accelerated toward the substrate, and
wherein the first etching condition is such that the bias radio frequency electric power supply generates a pulse-like oscillation having a frequency in a range, in which a positive ion in the plasma is capable of following the bias electric field.

31. The method according to claim 30,
wherein the frequency is equal to or lower than 600 kHz.

32. The method according to claim 29,
wherein the reactive ion etching method is performed by etching equipment including an activating radio frequency electric power supply for activating the reactive gas to generate plasma and a bias radio frequency electric power supply for applying a bias electric field,
wherein the bias radio frequency electric power supply applies the bias electric field to the substrate so that a reactive ion in the plasma is accelerated toward the substrate, and
wherein the first etching condition is such that the activating radio frequency electric power supply generates a pulse-like oscillation, and the bias radio frequency electric power supply generates the bias electric field having a frequency in a range, in which a positive ion in the plasma is capable of following the bias electric field.

33. The method according to claim 32,
wherein the frequency is equal to or lower than 600 kHz.

34. The method according to claim 29,
wherein the reactive ion etching method is performed by etching equipment including an activating radio frequency electric power supply for activating the reactive gas to generate plasma and a bias radio frequency electric power supply for applying a bias electric field,
wherein the bias radio frequency electric power supply applies the bias electric field to the substrate so that a reactive ion in the plasma is accelerated toward the substrate, and
wherein the first etching condition in the step of forming the trench is such that the bias radio frequency electric power supply generates a pulse-like oscillation having a first frequency in a range, in which a positive ion in the plasma is capable of following the bias electric field, and
wherein the second etching condition in the step of forming the movable portion is such that the bias radio frequency electric power supply generates a continuous oscillation having a second frequency in a range, in which a positive ion in the plasma is not capable of following the bias electric field.

35. The method according to claim 28,
wherein the second etching condition in the step of forming the movable portion is such that the insulation layer disposed on the bottom of the trench is charged.

36. The method according to claim 35,
wherein the reactive ion etching method is performed by etching equipment including an activating radio frequency electric power supply for activating the reactive gas to generate plasma and a bias radio frequency electric power supply for applying a bias electric field, wherein the bias radio frequency electric power supply applies the bias electric field to the substrate so that a reactive ion in the plasma is accelerated toward the substrate, and wherein the second etching condition is such that the bias radio frequency electric power supply generates a continuous oscillation having a second frequency in a range, in which a positive ion in the plasma is not capable of following the bias electric field.

37. The method according to claim 36,
wherein the second frequency is equal to or higher than 600 kHz.

38. The method according to claim 35,
wherein the reactive ion etching method is performed by etching equipment including an activating radio frequency electric power supply for activating the reactive gas to generate plasma and a bias radio frequency electric power supply for applying a bias electric field, wherein the bias radio frequency electric power supply applies the bias electric field to the substrate so that a reactive ion in the plasma is accelerated toward the substrate, and wherein the second etching condition is such that the activating radio frequency electric power supply generates a continuous oscillation, and the bias radio frequency electric power supply generates a bias electric field having a second frequency in a range, in which a positive ion in the plasma is not capable of following the bias electric field.

39. The method according to claim 38,
wherein the second frequency is equal to or higher than 600 kHz.

40. The method according to claim 28,
wherein the reactive ion etching method is performed in such a manner that an etching step and a deposition step are alternately and repeatedly performed, wherein the etching step is such that an etching gas in the plasma state etches the semiconductor layer, and wherein the deposition step is such that a deposition gas in the plasma state deposits a protection film on the inner wall of the trench.

41. The method according to claim 40,
wherein an amount of etching of the semiconductor layer in the etching step is defined as W1, wherein an amount of deposition of the protection film in the deposition step is defined as W2, wherein a ratio of the amounts between the etching and the deposition is defined as W2/W1, and wherein the ration of W2/W1 in the step of forming the movable portion is smaller than the ration of W2/W1 in the step of forming the trench.

42. A method for manufacturing a semiconductor device, the method comprising the steps of:

preparing a semiconductor substrate including an insulation layer and a semiconductor layer, wherein the insulation layer is disposed inside of the substrate, and the semiconductor layer is disposed on a surface of the substrate;

forming a mask having a predetermined pattern on the semiconductor layer;

forming a trench on the semiconductor layer by etching the semiconductor layer through the mask, wherein the trench is disposed from the surface of the semiconductor layer and reaches the insulation layer; and forming a movable portion by etching a sidewall of the trench disposed near the bottom of the trench in a direction parallel to the insulation layer so that the semiconductor layer is separated from the insulation layer, wherein the steps of forming the trench and the movable portion are performed by a reactive ion etching method such that the substrate is mounted in a vacuum chamber and a reactive gas is introduced into the chamber to become a plasma state, wherein the reactive ion etching method is performed in such a manner that an etching step and a deposition step are alternately and repeatedly performed or simultaneously performed, wherein the etching step is such that an etching gas in the plasma state etches the semiconductor layer, wherein the deposition step is such that a deposition gas in the plasma state deposits a protection film on the inner wall of the trench, and wherein each step of forming the trench and forming the movable portion includes a different etching condition so that a protection effect of the protection film in the step of forming the movable portion is comparatively weaker than that in the step of forming the trench.

43. The method according to claim 42,
wherein the etching step in the step of forming the trench has a running time defined as TA1, and the deposition step in the step of forming the trench has another running time defined as TA2 so that a first time ratio between TA1 and TA2 is defined as TA1/TA2, wherein the etching step in the step of forming the movable portion has a running time defined as TB1, and the deposition step in the step of forming the movable portion has another running time defined as TB2 so that a second time ratio between TB1 and TB2 is defined as TB1/TB2, and wherein the first time ratio of TA1/TA2 is set to be smaller than the second time ratio of TB1/TB2 so that the protection effect of the protection film in the step of forming the movable portion is comparatively weaker than that in the step of forming the trench.

44. The method according to claim 42,
wherein the etching step in the step of forming the trench has a first electric power of a bias electric field applied to the substrate, wherein the etching step in the step of forming the movable portion has a second power of the bias electric field, and wherein the first power of the bias electric field is set to be smaller than the second power of the bias electric field so that the protection effect of the protection film in the step of forming the movable portion is comparatively weaker than that in the step of forming the trench.

45. The method according to claim 42,
wherein the etching step in the step of forming the trench has a first gas flow rate of the etching gas, wherein the etching step in the step of forming the movable portion has a second gas flow rate of the etching gas, and wherein the first gas flow rate is set to be smaller than the second gas flow rate so that the protection effect of the protection film in the step of forming the movable portion is comparatively weaker than that in the step of forming the trench.

46. The method according to claim 42,
wherein the etching step in the step of forming the trench has a first gas flow rate of the deposition gas,
wherein the etching step in the step of forming the movable portion has a second gas flow rate of the deposition gas, and
wherein the first gas flow rate is set to be larger than the second gas flow rate so that the protection effect of the protection film in the step of forming the movable portion is comparatively weaker than that in the step of forming the trench.

47. The method according to claim 42,
wherein the etching step in the step of forming the trench has a first chamber pressure,
wherein the etching step in the step of forming the movable portion has a second chamber pressure, and
wherein the second chamber pressure is set to be lower than the first chamber pressure so that the protection effect of the protection film in the step of forming the movable portion is comparatively weaker than that in the step of forming the trench.

48. The method according to claim 42,
wherein the etching step in the step of forming the trench has a first substrate temperature,
wherein the etching step in the step of forming the movable portion has a second substrate temperature, and
wherein the first substrate temperature is set to be lower than the second substrate temperature so that the protection effect of the protection film in the step of forming the movable portion is comparatively weaker than that in the step of forming the trench.

49. The method according to claim 42,
wherein the movable portion has a convexity disposed on a bottom of the movable portion, which faces the insulation layer.

50. The method according to claim 42,
wherein the trench has a depth defined as H and a width defined as W so that an aspect ratio of the trench is H/W, and
wherein at least one of the neighboring trenches disposed on both sides of a movable-portion-to-be-formed portion of the second semiconductor layer has the aspect ratio equal to or larger than 2.5.

51. The method according to claim 42,
wherein the trench has a depth defined as H and a width defined as W so that an aspect ratio of the trench is H/W, and
wherein the movable portion is supported on the insulation layer through an anchor, which connects to the movable portion and is surrounded by the trench, and
wherein at least two trenches disposed on two adjoining sides of the anchor have the aspect ratio equal to or smaller than 2.

52. The method according to claim 51,
wherein the anchor includes a wiring portion and an electrode pad, and
wherein the wiring portion is disposed between the anchor and the movable portion.

53. The method according to claim 42,
wherein the second semiconductor layer is made of silicon.

54. The method according to claim 42,
wherein the insulation layer is made of silicon oxide.

55. The method according to claim 42,
wherein the movable portion is used for a movable portion of a physical quantity sensor, which is movable in accordance with a physical quantity applied to the sensor.

56. The method according to claim 55,
wherein the physical quantity sensor is an acceleration sensor, a gyro sensor, a pressure sensor, a gas sensor, a gas flow sensor, an infrared light sensor, or a semiconductor humidity sensor.

* * * * *